US008245118B2

(12) United States Patent
Kikuchi et al.

(10) Patent No.: US 8,245,118 B2
(45) Date of Patent: *Aug. 14, 2012

(54) ARCHITECTURE AND CONTROL OF REED-SOLOMON ERROR IDENTIFICATION AND EVALUATION

(75) Inventors: Ichiro Kikuchi, Yokohama (JP); Siu-Hung Fred Au, Fremont, CA (US); Gregory Burd, San Jose, CA (US); Zining Wu, Los Altos, CA (US); Jun Xu, Sunnyvale, CA (US); Tony Yoon, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 400 days.

This patent is subject to a terminal disclaimer.

(21) Appl. No.: 12/512,710

(22) Filed: Jul. 30, 2009

(65) Prior Publication Data
US 2009/0292976 A1 Nov. 26, 2009

Related U.S. Application Data

(62) Division of application No. 11/195,403, filed on Aug. 1, 2005, now Pat. No. 7,590,923.

(60) Provisional application No. 60/622,429, filed on Oct. 27, 2004, provisional application No. 60/680,969, filed on May 12, 2005.

(51) Int. Cl.
  *H03M 13/00* (2006.01)
(52) U.S. Cl. .......................... 714/784; 714/780
(58) Field of Classification Search .................. 714/784, 714/780
  See application file for complete search history.

(56) References Cited

U.S. PATENT DOCUMENTS

| | | | |
|---|---|---|---|
| 4,541,092 A | 9/1985 | Sako et al. | |
| 4,839,896 A * | 6/1989 | Glover et al. | 714/759 |
| 5,216,676 A * | 6/1993 | Kimura | 714/782 |
| 5,226,043 A | 7/1993 | Pughe, Jr. et al. | |
| 5,373,511 A | 12/1994 | Veksler | |
| 5,450,421 A | 9/1995 | Joo et al. | |
| 5,452,310 A | 9/1995 | Arts | |
| 5,699,368 A | 12/1997 | Sakai et al. | |
| 5,732,093 A | 3/1998 | Huang | |
| 5,761,102 A * | 6/1998 | Weng | 708/492 |
| 5,844,918 A | 12/1998 | Kato | |

(Continued)

OTHER PUBLICATIONS

R. Blahut, *Theory and Practice of Error Control Codes*, p. 267-272, 1983.
Chase, "A Class of Algorithms for Decoding Block Codes with Channel Measurement Information," *IEEE Trans. Infor. Theory*, vol. IT-18, No. 1, Jan. 1972, pp. 170-182.
G.D. Forney, Jr., "Generalized Minimum Distance Decoding," *IEEE Trans. Infor. Theory*, vol. IT-12, No. 2, Apr. 1966, pp. 125-131.

(Continued)

*Primary Examiner* — M. Mujtaba K Chaudry

(57) ABSTRACT

Systems and methods are provided for implementing error identification and evaluation for a Reed-Solomon (RS) error-correction code (ECC) system. The BMA algorithm and/or list decoding may produce one or more error locator polynomials that are related to a decision-codeword. An accelerated Chien search can be used to more quickly evaluate the one or more error locator polynomial. If the accelerated Chien search identifies a valid error locator polynomial, a normal Chien search can be used to identify error locations, and Forney's algorithm or an equivalent technique can be used to evaluate the error values. A RS ECC decoder can include a computation circuit that evaluates an error locator polynomial or an error evaluator polynomial. The computation circuit can include computation components that receive the coefficients of the polynomials.

20 Claims, 18 Drawing Sheets

U.S. PATENT DOCUMENTS

| | | | |
|---|---|---|---|
| 5,912,905 | A | 6/1999 | Sakai et al. |
| 6,275,964 | B1 | 8/2001 | Nagin et al. |
| 6,279,137 | B1 * | 8/2001 | Poeppelman et al. ........ 714/781 |
| 6,625,775 | B1 | 9/2003 | Kim |
| 6,634,007 | B1 | 10/2003 | Koetter et al. |
| 6,961,197 | B1 | 11/2005 | Burd |
| 7,099,411 | B1 | 8/2006 | Wu |
| 7,120,850 | B2 | 10/2006 | Lehobey et al. |
| 7,131,052 | B2 | 10/2006 | Hassner et al. |
| 7,185,259 | B2 | 2/2007 | Fujita et al. |
| 7,203,893 | B2 | 4/2007 | Kerr et al. |
| 7,231,579 | B1 * | 6/2007 | Pines et al. .................... 714/762 |
| 7,328,395 | B1 | 2/2008 | Burd |
| 7,444,582 | B1 | 10/2008 | Au et al. |
| 7,454,690 | B1 | 11/2008 | Au et al. |
| 2003/0103582 | A1 | 6/2003 | Linsky et al. |
| 2003/0128777 | A1 | 7/2003 | Linsky et al. |
| 2004/0018735 | A1 | 1/2004 | Park et al. |
| 2005/0278610 | A1 * | 12/2005 | Banks .......................... 714/784 |

OTHER PUBLICATIONS

V. Guruswami, M. Sudan, "Improved Decoding of Reed-Solomon and Algebraic-Geometry Codes," *IEEE Trans. Infor. Theory*, vol. 45, No. 6, Sep. 1999, pp. 1757-1767.

R. Koetter and A. Vardy, "Algebraic Soft-Decision Decoding of Reed-Solomon Codes", *IEEE Trans. Infor. Theory*, vol. 49, No. 11, Nov. 2003, pp. 2809-2825.

M. Sudan, "Decoding of Reed Solomon codes beyond the error-correction bound," J. complexity, vol. 12, pp. 180-193, 1997.

E. Berlekamp, *Algebraic Coding Theory*, pp. 218-240, 1984.

U.S. Appl. No. 10/313,651, filed Dec. 6, 2002.

* cited by examiner

| Clock Cycle | x | Ω(x) |
|---|---|---|
| 1 | $\alpha^0$ | $\Omega(\alpha^0)$ |
| 2 | $\alpha^{-1}$ | $\Omega(\alpha^{-1})$ |
| 3 | $\alpha^{-2}$ | $\Omega(\alpha^{-2})$ |
| ⋮ | ⋮ | ⋮ |
| n | $\alpha^{-(n-1)}$ | $\Omega(\alpha^{-(n-1)})$ |

| | Clock Cycle | Latch Content |
|---|---|---|
| $\overline{\text{Ready}} = 1$ | — | $\Omega_j$ |
| $\overline{\text{Ready}} = 0$ | 1 | $\Omega_j(\alpha^{-1})^j$ |
| | 2 | $\Omega_j(\alpha^{-2})^j$ |
| | 3 | $\Omega_j(\alpha^{-3})^j$ |
| | ⋮ | ⋮ |
| | *n-1* | $\Omega_j(\alpha^{-(n-1)})^j$ |

| | Clock Cycle | Top Latch Content | Bottom Latch Content |
|---|---|---|---|
| $\overline{\text{Ready}} = 1$ | — | $\Lambda_j$ | $\Lambda_j$ |
| $\overline{\text{Ready}} = 0$ | 1 | $\Lambda_j(\alpha^{-2})^j$ | $\Lambda_j(\alpha^{-1})^j$ |
| | 2 | $\Lambda_j(\alpha^{-4})^j$ | $\Lambda_j(\alpha^{-3})^j$ |
| | 3 | $\Lambda_j(\alpha^{-6})^j$ | $\Lambda_j(\alpha^{-5})^j$ |
| | ⋮ | ⋮ | ⋮ |
| | $n/2$ | $\Lambda_j(\alpha^{-(n-1)})^j$ | $\Lambda_j(\alpha^{-(n-2)})^j$ |

FIG. 18

ARCHITECTURE AND CONTROL OF REED-SOLOMON ERROR IDENTIFICATION AND EVALUATION

CROSS-REFERENCE TO RELATED APPLICATIONS

This application is a division of copending, commonly-assigned U.S. patent application Ser. No. 11/195,403, filed Aug. 1, 2005, which claims the benefit of U.S. Provisional Application No. 60/622,429, filed Oct. 27, 2004, and 60/680,969, filed on May 12, 2005, each of which is incorporated herein by reference in its respective entirety.

BACKGROUND OF THE INVENTION

This invention relates to Reed-Solomon error-correction codes (RS ECC) and, more particularly, to systems and methods for implementing the RS ECC receive-side operations.

Electronic information is increasingly being relied upon as a preferred medium for conducting business and/or personal transactions. As a result, demands for even better information storage and/or communication technologies are also increasing. The advances in this area of technology are apparent in telecommunication and information storage devices, where developments in throughput and storage density are allowing users to process information at much greater rates and quantities than before.

To guarantee some degree of information integrity, many communications and storage devices include error-correction technologies. Such technologies generally involve configuring information in a way that allows the information to be recoverable even when parts of the information are altered or missing. In error-correction, this process of configuring information is referred to as "encoding," and the counterpart process of recovering information is referred to as "decoding." Therefore, unless otherwise specified, the term "coding" will be used herein to refer to a particular way of encoding and decoding information.

In the field of error-correction codes (ECC), of particular note is the Reed-Solomon (RS) error-correction code. Since its discovery, the Reed-Solomon ECC has had a profound impact on the information industry in terms of shaping consumer expectations. In modern day applications, the Reed-Solomon ECC can be found in everyday devices such as the compact disk players, where RS ECC technology has helped to provide high quality audio playback even from scratched CD surfaces.

Despite its effectiveness, the suitability of the Reed-Solomon ECC in certain applications may be limited by practical considerations. RS ECC encoding and decoding techniques are relatively complex, and practical issues generally concern whether RS ECC operations can be completed in the time and using the resources allotted by an application. Interestingly, when the RS ECC was first developed, processing technology had not yet developed to the point where applying the RS ECC in consumer devices was practical. Although technology for implementing RS ECC has improved greatly since then, technological improvements in applications that benefit from RS ECC have also kept pace. Accordingly, allowances of time, power, and/or hardware resources for RS ECC in modern applications continue to become more stringent.

Developments in coding theory continue to improve the capabilities of the RS ECC. In conjunction with these efforts, device and architectural improvements in implementation continue to aid its application to conventional and emerging electronic devices. Accordingly, there is continued interest in improving the Reed-Solomon error-correction code on both a theoretical and a practical level.

SUMMARY OF THE INVENTION

In accordance with the disclosed invention, systems and methods are provided for implementing various aspects of a Reed-Solomon (RS) error-correction coding system (ECC). In general, a decoder that uses soft-information to perform decoding is referred to as a "soft decoder" and a decoder that does not use soft-information to perform decoding is referred to as a "hard decoder." The disclosed systems and methods provide a hard Reed-Solomon ECC RS(n,k) that has the capability to correct up to $t=(n-k)/2$ symbols in a decision-codeword. When the number of symbol errors in a decision-codeword is greater than t, a soft RS ECC decoder system and method using soft-information is provided that has the capability to correct more than t errors. Where a RS ECC decoder is referred to herein without a "soft" or "hard" designation, it will be understood that the RS ECC decoder can refer to one or both types of RS ECC decoders.

In accordance with one aspect of the invention, a decision-codeword that is received from a communication channel may contain errors. An error correction circuit in a RS ECC can operate to identify the location of errors in a decision-codeword and/or evaluate the value of the errors. If a decision-codeword contains more than t errors, list decoding can be used to generate one or more modified decision-codewords. An error correction circuit can also operate to identify error locations and/or compute error values for modified decision-codewords.

Specifically, the BMA algorithm or list decoding can produce one or more error locator polynomials in connection with decision-codewords and/or modified decision-codewords. An error correction circuit can use a Chien search to identify the locations of errors in a decision-codeword to determine if the error locator polynomial associated with a decision-codeword is valid. If the error locator polynomial is determined to be valid, the error correction circuit can evaluate error values for the error locations identified by the Chien search. The evaluated error values can then be used to correct errors in the decision-codeword. In one embodiment, error locations and error values can be computed concurrently, and a determination regarding the validity of an error locator polynomial can made at the end of the computations.

In accordance with one aspect of the disclosed invention, an error correction circuit can configurable to operate in two modes. In the first mode, the circuit performs Chien search and error evaluation concurrently. In the second mode, the circuit performs an accelerated Chien search by using error evaluation resources to perform Chien search computations. Accordingly, the length of time required to complete a Chien search is shorter when the circuit operates in the accelerated Chien search mode than when it operates in the first mode.

The error correction circuit can include circuitry for evaluating an error locator polynomial for different symbol locations. In one embodiment, the terms of an error locator polynomial can be separately computed and then summed by one or more summation blocks. In one embodiment, a first summation block computes the sum of even-positioned polynomial terms, and a second summation block computes the sum of odd-positioned polynomial terms. The results of these two summation blocks can then be summed together to evaluate the error locator polynomial.

In accordance with one aspect of the disclosed invention, there are several formulas for computing error values. They include $$e_i = \frac{X^{2-b}\Omega(X_i^{-1})}{\Lambda'(X_i^{-1})},$$

which is Forney's algorithm, or $$e_i = \frac{X^{-(2t-2+b)}}{B(X_i^{-1})\Lambda'(X_i^{-1})}.$$

These error value formulas have different computational complexities and one may be more suitable for certain applications than the others.

In one aspect of the disclosed invention, the two-mode error correction circuit can be used when there are multiple error locator polynomials. The error correction circuit can more quickly determine the validity of the error locator polynomials by using accelerated Chien search mode. Once the Chien search identifies a valid error location polynomial, the error correction circuit can change modes so that the error locations can be identified at the same time that error values are being computed.

In one aspect of the disclosed invention, a computation circuit for evaluating an error locator polynomial and/or an error evaluator polynomial can include several computation components. Each computation component can receive a coefficient from the error locator polynomial and a coefficient from the error evaluator polynomial. The computation circuit can be configured to evaluate the error locator polynomial and an error evaluator polynomial concurrently or to only evaluate the error locator polynomial.

In accordance with one aspect of the invention, an RS ECC decoder can include an error correction means for identifying the location of errors in a decision-codeword and/or evaluating the value of the errors. The error correction means can include a list decoding means for generating one or more modified decision-codewords if a decision-codeword contains more than t errors. The error correction means can include means for identifying error locations and/or means for computing error values for modified decision-codewords.

Additionally, an RS ECC decoder can include a means for performing the BMA algorithm or a means for performing list decoding to produce one or more error locator polynomials in connection with decision-codewords and/or modified decision-codewords. An error correction means can include a identifying means for identifying the locations of errors in a decision-codeword using Chien search to determine if the error locator polynomial associated with a decision-codeword is valid. The error correction means can include evaluating means for evaluating error values for the error locations identified by the identifying means. The evaluated error values can then be used by the error correction means for correcting errors in the decision-codeword. In one embodiment, an RS ECC decoder can include control means for configuring the error correction means to compute error locations and error values concurrently.

In accordance with one aspect of the disclosed invention, an error correction means can configurable to operate in two modes. In the first mode, the error correction means performs Chien search and error evaluation concurrently. In the second mode, the error correction means performs an accelerated Chien search by using error evaluation resources to perform Chien search computations. Accordingly, the length of time required to complete a Chien search is shorter when the error correction means operates in the accelerated Chien search mode than when it operates in the first mode.

The error correction means can include means for evaluating an error locator polynomial for different symbol locations. In one embodiment, the terms of an error locator polynomial can be separately computed and then summed by one or more summation means. In one embodiment, the error correction means can include a first summation means for computing the sum of even-positioned polynomial terms, a second summation means for computing the sum of odd-positioned polynomial terms, and a third summation means for summing the results of these two summation computations to evaluate the error locator polynomial.

In accordance with one aspect of the disclosed invention, there are several means for computing error values. They include means for computing $$e_i = \frac{X^{2-b}\Omega(X_i^{-1})}{\Lambda'(X_i^{-1})},$$

which is Forney's algorithm, and means for computing $$e_i = \frac{X^{-(2t-2+b)}}{B(X_i^{-1})\Lambda'(X_i^{-1})}.$$

In one aspect of the disclosed invention, the two-mode error correction means can be used when there are multiple error locator polynomials. The error correction means can more quickly determine the validity of the error locator polynomials by using accelerated Chien search mode. Once the error correction means identifies a valid error location polynomial, the error correction means can change modes so that the error locations can be identified at the same time that error values are being computed.

In one aspect of the disclosed invention, a RS ECC decoder can include computation means for evaluating an error locator polynomial and/or an error evaluator polynomial. The computation means can include several sub-computation means, where each sub-computation means can include means for receiving a coefficient from the error locator polynomial and a coefficient from the error evaluator polynomial. The RS ECC decoder can include means for configuring the computation means to evaluate the error locator polynomial and an error evaluator polynomial concurrently or to only evaluate the error locator polynomial.

In accordance with one aspect of the invention, an RS ECC decoder can include a computer program running on a process for performing for identifying the location of errors in a decision-codeword and/or evaluating the value of the errors. The computer program and/or processor can perform list decoding to generate one or more modified decision-codewords if a decision-codeword contains more than t errors. The computer program and/or processor can identify error locations and/or means for computing error values for modified decision-codewords.

Additionally, an RS ECC decoder can include a computer program running on a processor for performing the BMA algorithm or for performing list decoding to produce one or more error locator polynomials in connection with decision-codewords and/or modified decision-codewords. The computer program and/or processor can identify the locations of errors in a decision-codeword using Chien search to determine if the error locator polynomial associated with a decision-codeword is valid, and evaluate error values for the any identified error locations. The computer program and/or processor can use the evaluated error values to correct errors in the decision-codeword. In one embodiment, the computer program can compute error locations and error values concurrently.

In accordance with one aspect of the disclosed invention, a computer program running on a processor can perform computation in two modes. In the first mode, the computer program and/or processor performs Chien search and error evaluation concurrently. In the second mode, the computer program and/or processor performs an accelerated Chien search. Accordingly, the length of time required to complete a Chien search is shorter in the accelerated Chien search mode than in the first mode.

The computer program can include a program for evaluating an error locator polynomial for different symbol locations. In one embodiment, the terms of an error locator polynomial can be separately computed and then summed by one or more summation means. In one embodiment, the computer program can compute the sum of even-positioned polynomial terms, the of odd-positioned polynomial terms, and the sum of these two results, to evaluate the error locator polynomial.

In accordance with one aspect of the disclosed invention, a computer program running on a processor can compute various formulas for evaluating error values. The computer program can include a program for computing $$e_i = \frac{X^{2-b}\Omega(X_i^{-1})}{\Lambda'(X_i^{-1})},$$

which is Forney's algorithm, and a program for computing $$e_i = \frac{X^{-(2t-2+b)}}{B(X_i^{-1})\Lambda'(X_i^{-1})}.$$

In one aspect of the disclosed invention, the two-mode computer program can be used when there are multiple error locator polynomials. The computer program can more quickly determine the validity of the error locator polynomials by using accelerated Chien search mode. Once the computer program identifies a valid error location polynomial, the computer program can change modes so that the error locations can be identified at the same time that error values are being computed.

Further features of the invention, its nature and various advantages, will be more apparent from the accompanying drawings and the following detailed description of the various embodiments.

BRIEF DESCRIPTION OF THE DRAWINGS

FIG. 18 is a table showing an exemplary evaluation of a term of an error locator polynomial over multiple cycles of a clock signal based on the circuit of FIG. 17;

DETAILED DESCRIPTION

This application is related to application Ser. No. 11/195,087 and application Ser. No. 11/195,183, which applications are hereby incorporated herein by reference in their entirety.

The disclosed technology is directed to systems and methods for implementing a Reed-Solomon error-correction code (RS ECC). In applications or devices where information may be altered by interference signals or other phenomena, Reed-Solomon ECC provides a measured way to protect information against such interference. As used herein, "information" refers to any unit or aggregate of energy or signals that contain some meaning or usefulness.

Figure 1:
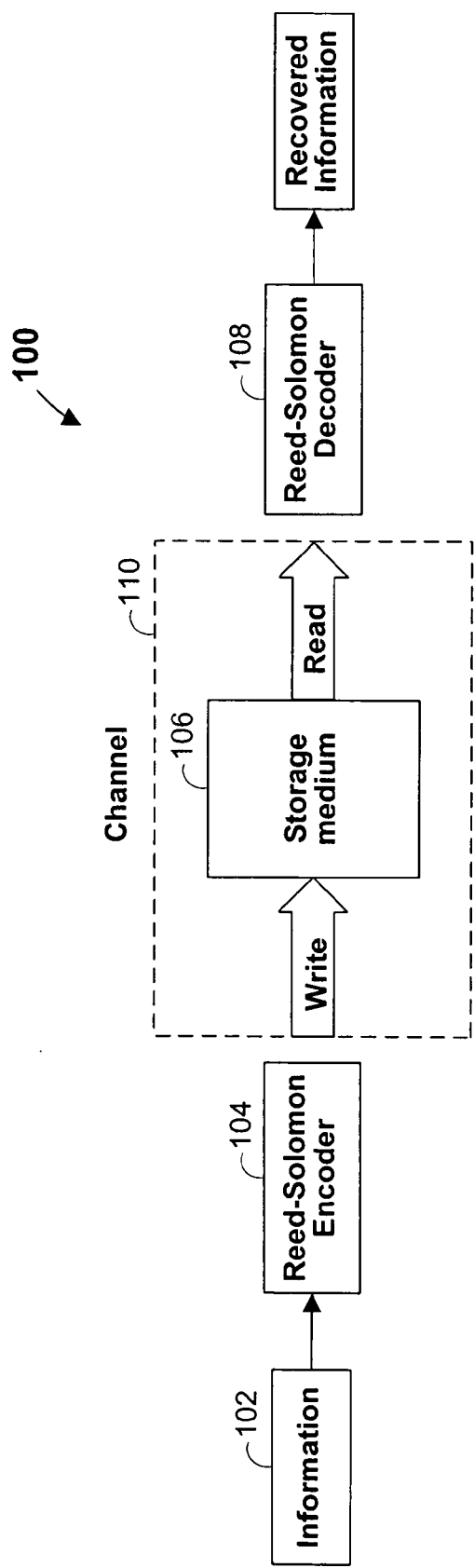
FIG. 1 is a block diagram of an exemplary storage system that employs Reed-Solomon error-correction coding (RS ECC)

Referring to FIG. 1, there is shown an exemplary information storage system 100 that employs a Reed-Solomon error-correction code. Information 102 that is intended for storage can be encoded by a RS ECC encoder 104 before being written to the storage medium 106. Upon retrieving the encoded information from the storage medium, an RS ECC decoder 108 can decode the retrieved information to recover the original information 102. The Reed-Solomon ECC is described in U.S. patent application Ser. No. 11/006,381 (filed Dec. 7, 2004, hereinafter the "Burd reference"), which is hereby incorporated herein by reference in its entirety.

Unless otherwise specified, the terminology used in the Burd reference will also apply herein.

With continuing reference to FIG. 1, the RS ECC provides some protection for the information stored on the storage medium 106. This information may encounter a number of error-producing phenomena, such as device physical failure, device electrical failure, signal interference, and/or data loss due to buffer overflow, for example. As used herein, a "channel" will refer to the devices and/or processing stages that occur between an RS ECC encoder and an RS ECC decoder and can correspond to a particular path of media/devices through which a signal can flow, a particular wavelength or time slot which a signal can utilize, and/or another multiple access scheme. For example, in FIG. 1, the channel 110 can correspond to storage and write and read components of a disk drive, including a magnetic storage medium, a disk-drive read/write head, and other storage system components. As used herein, a "read path" of a storage system that stores encoded information includes components and devices that operate to produce un-encoded information and can include an RS ECC decoder 108. Also, the interference signals and other error-producing phenomena in a channel will be referred to herein as "noise." The terms channel and noise are more conceptual than physical and are often difficult to define physically. Even so, as shown by FIG. 1, they do correspond to physical components and devices.

Figure 2:
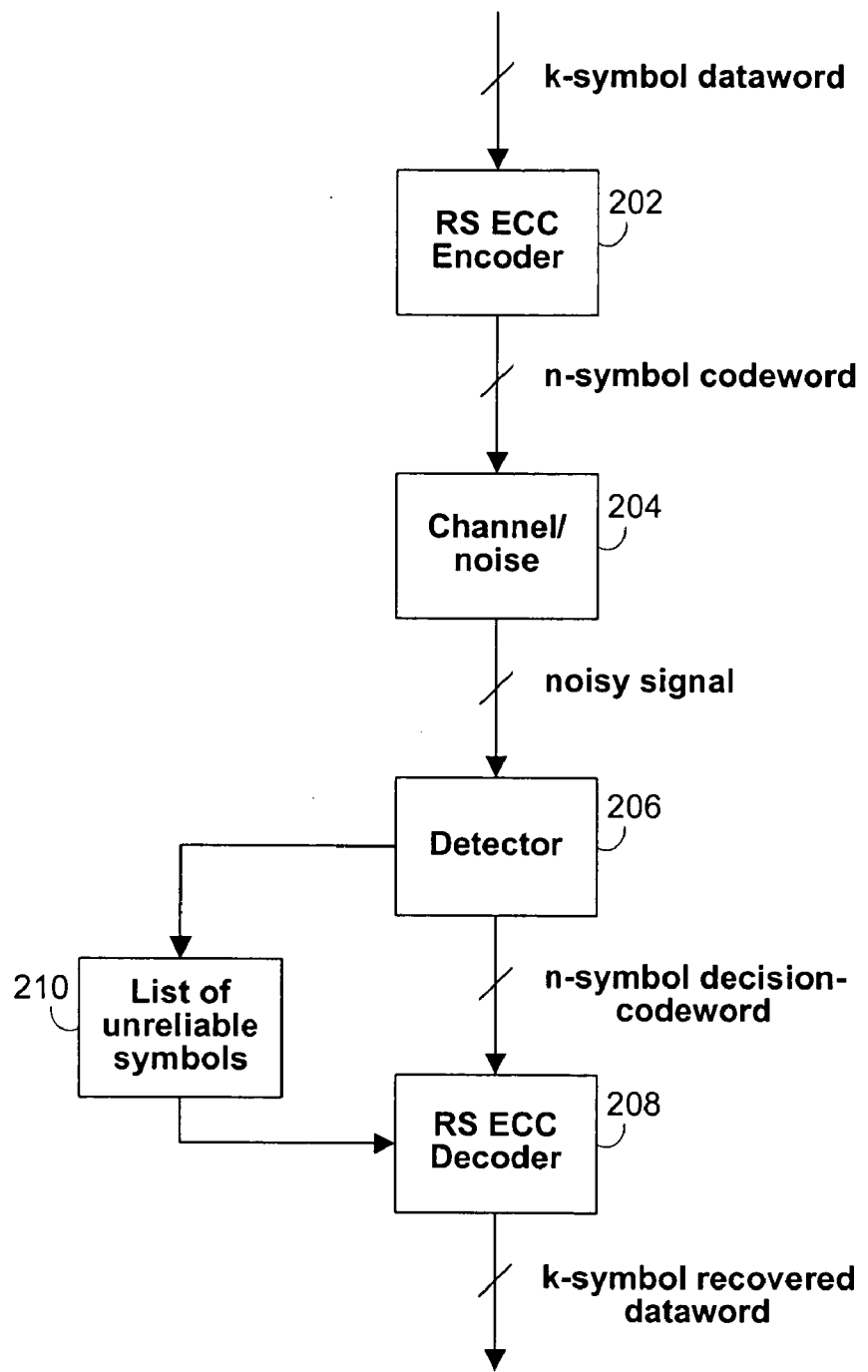
FIG. 2 is a block diagram of a generic system that employs soft-information with Reed-Solomon error-correction coding.

As described in the Burd reference, an RS ECC operates based on units of information called "symbols" and "words," and the operations occur in an encoder and a decoder. Referring to FIG. 2, an RS ECC encoder 202 generally operates to convert a k-symbol dataword into an n-symbol codeword of greater length. Because of this, a Reed-Solomon code is generally identified in shorthand as RS(n,k). RS(n,k) is referred to as a "systematic" code if the n-symbol codeword contains the original k-symbol dataword. These original k symbols are called systematic symbols and the additional (n−k) symbols in the codeword are called "parity" symbols. The n-symbol codeword can be communicated over a channel 204. While in the channel 204, the signal may encounter noise so that an n-symbol word that corresponds to a noisy signal received by a detector 206 may be different from the corresponding codeword that entered the channel 204. This n-symbol word produced by the detector 206 is called a decision-codeword. Thus, the task of the RS ECC decoder 208 is to recover the original dataword from a decision-codeword.

An RS ECC decoder may not always be able to recover the original dataword. As described in the Burd reference, an RS ECC decoder 208 that does not use soft-information is capable of correcting up to t=(n−k)/2 symbol errors in a decision-codeword. In contrast, when the RS ECC decoder 208 uses soft-information to perform decoding, the RS ECC decoder 208 is capable of correcting more than t symbol errors. In practice, an RS ECC decoder first determines whether the errors in a decision-codeword can be corrected. This computation involves two procedures known as the Berlekamp-Massey algorithm (BMA algorithm) and the Chien search, which are described in the Burd reference. In summary, the BMA algorithm produces an error indicator based on the decision-codeword, and the Chien search determines whether the error indicator is "valid." Mis-corrections notwithstanding, if the error indicator is determined to be valid, then the number of symbol errors in the decision-codeword is less than or equal to t. In this case, the RS ECC decoder 208 can correct the errors in the decision-codeword using the Forney algorithm, for example.

In some instances, the number of symbol errors in a decision-codeword may exceed t. In this case, the Burd reference describes a technique known as "list decoding" that may be used to reduce the number of symbol errors in a decision-codeword. List decoding is also described in U.S. patent application Ser. No. 10/135,422, filed Apr. 29, 2002, and in U.S. patent application Ser. No. 10/313,651, filed Dec. 6, 2002, which applications are incorporated herein by reference in their entirety.

List decoding relies on identifying a list of unreliable symbols 210 in a decision-codeword and the symbols' next-most-likely values. This list and these values can be generated by a detector 206 or a post processor (not shown). One way to do so is described in U.S. patent application Ser. No. 09/901,507, filed Jul. 9, 2001, which is hereby incorporated herein by reference in its entirety. Essentially, list decoding is more or less a guess and check technique that may or may not locate and correct errors in a decision-codeword. Based on the premise that low-reliability symbols are more likely to have been detected incorrectly, replacing one or more low-reliability symbols with their next-most-likely values can reduce the number of symbol errors if any of the next-most-likely values happens to be a true and correct value. A decision-codeword whose symbols have been replaced as described is referred to as a modified decision-codeword. In one embodiment, whether the number of errors in a modified decision-codeword still exceeds t can be determined, as before, by applying the BMA algorithm and the Chien search. In embodiments where computation speed is a concern, other computations may be used in place of the BMA algorithm and Chien search. For example, the Burd reference describes an iterative way of generating error indicators, which will be referred to herein as "iterative decoding." While the Burd reference describes one way to perform iterative decoding, other variations are also possible. One variation is described in application Ser. No. 11/195,183. Another variation will now be described. Specifically, starting with error indicators (Λ(x), B(x), S(x)) for a decision-codeword, new error indicators $$\left(\hat{\Lambda}^{(e_l)}(x) = \frac{\Lambda^{(e_l)}(x)}{x + \alpha^{-j_l}}, B^{(e_l)}(x), S^{(e_l)}(x)\right)$$

for a modified decision-codeword can be computed by using the computations below:

$$\deg(\Lambda(x)) < \deg(B(x)) + 2 \qquad \text{Case 1}$$

$$\Lambda^{(e_l)}(x) = \Lambda(x) + ax\Lambda(x) + bxB(x) \qquad \text{(EQ1)}$$

$$B^{(e_l)}(x) = \Lambda(x) + cB(x) \qquad \text{(EQ2)}$$

$$\deg(\Lambda(x)) \geq \deg(B(x)) + 2 \qquad \text{Case 2}$$

$$\Lambda^{(e_l)}(x) = \Lambda(x) + axB(x) + bx^2 B(x) \qquad \text{(EQ3)}$$

$$B^{(e_l)}(x) = xB(x) + cB(x) \qquad \text{(EQ4)}$$

where the variables and their computations are described by the Burd reference. The Burd reference describes a way to predict the validity of an error indicator, which will be referred to herein as the "validity test." Specifically, when there is one extra syndrome, the validity test is:

$$\sum_{i=0} S_{2t-i} \Lambda_i = 0 = 0, \qquad \text{(EQ5)}$$

and when there are Δ extra syndromes, the validity test is:

$$\sum_{i=0} S_{2t+j-1-i} \Lambda_i = 0, \quad j=1, \ldots, \Delta. \quad (EQ6)$$

One of equations EQ5 and EQ6 is used depending on the number of extra syndromes. When the equality or equalities are determined to be true, the new error locator polynomial can be presumed to be valid and can be passed to a Chien search module where it's validity can be verified. From here on, it will be assumed that list decoding uses iterative decoding to generate error indicators for a modified decision-codeword and predicts the validity of the error indicators using the validity test.

Figure 3:
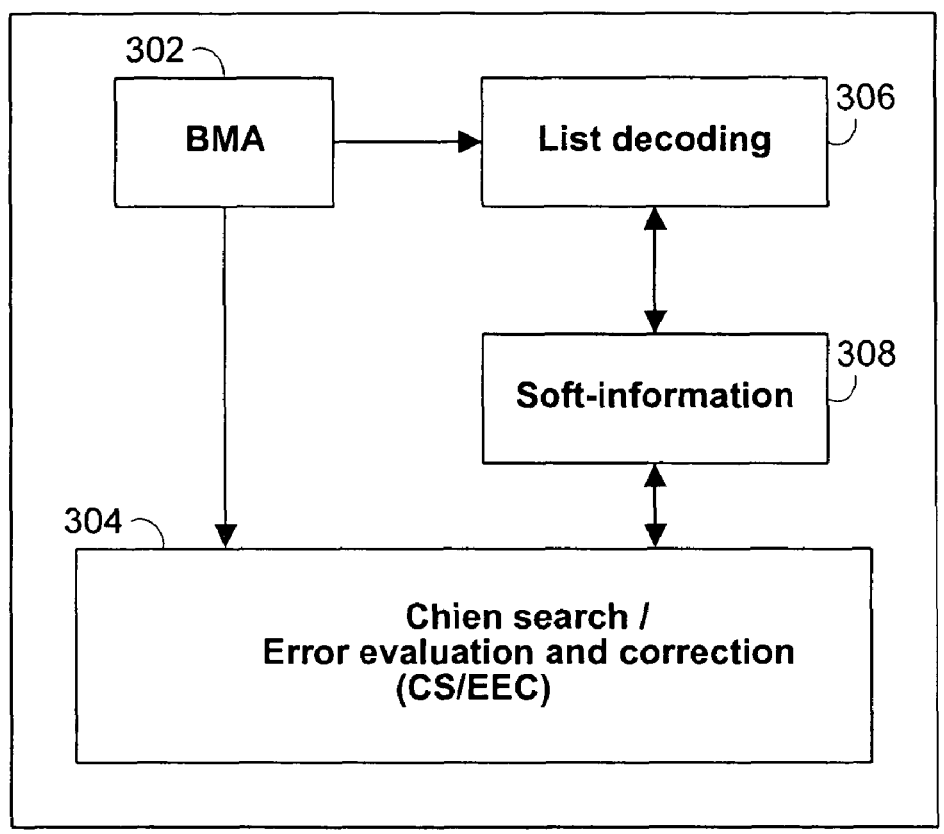
FIG. 3 is a block diagram of an exemplary Reed-Solomon ECC decoder that employs soft-information and list decoding.

Referring now to FIG. 3, there is shown one embodiment of an RS ECC decoder 300. In accordance with what has been described thus far, the exemplary RS ECC decoder includes a BMA algorithm component 302, a Chien search/error evaluation and correction component ("CS/EEC" component) 304, a list decoding component 306, and a soft-information component 308. The soft-information component 308 can store and/or access the list of least reliable symbols and the corresponding next-most-likely values. The RS ECC decoder 300 and its components can be implemented using digital hardware, analog hardware, and/or a processor architecture with programmable instructions. Furthermore, two or more components may operate in whole or in part based on shared circuitry and/or other shared resources.

Figure 4:
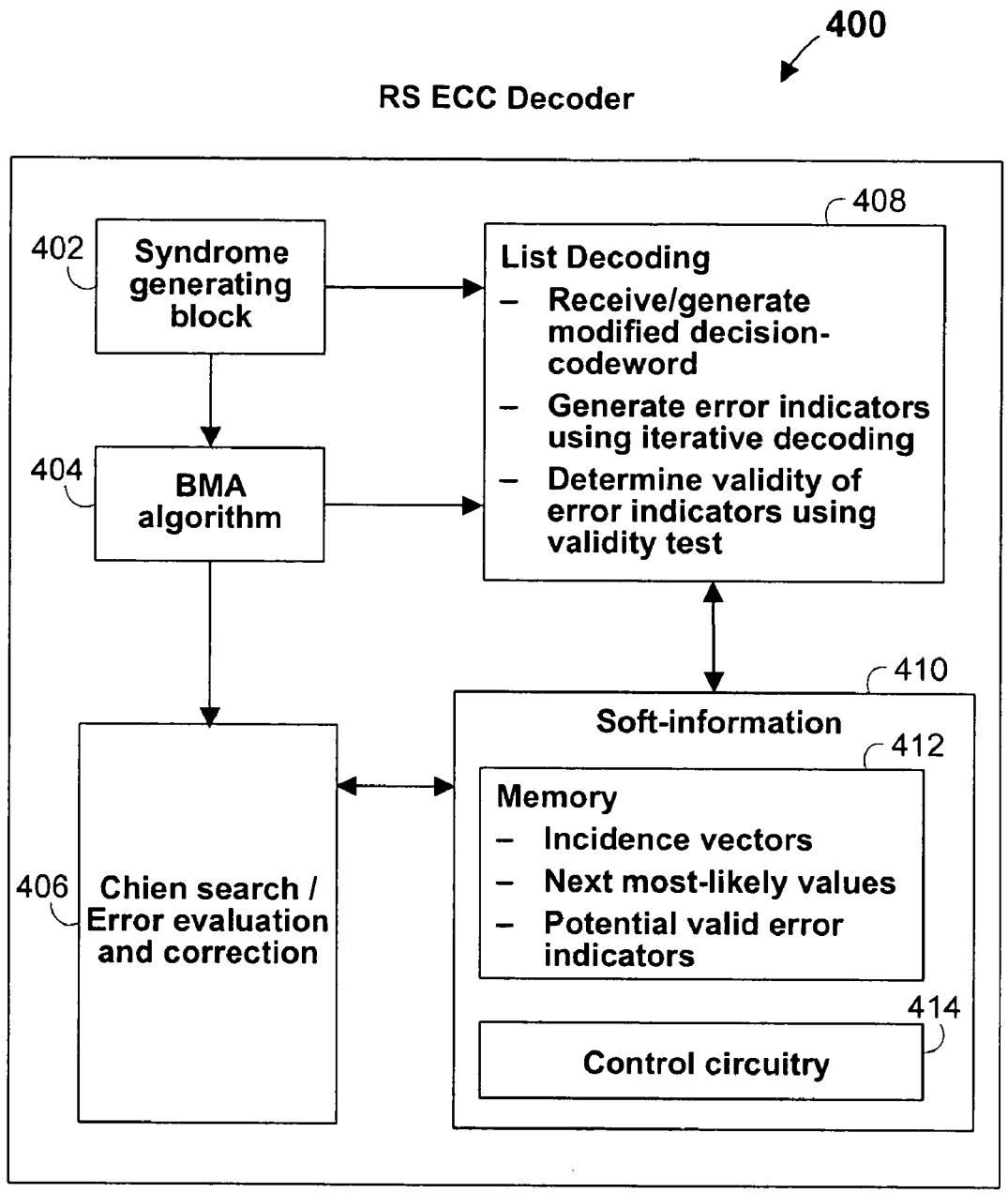
FIG. 4 is a more detailed block diagram of an RS ECC decoder.

Referring to FIG. 4, there is shown a variation of the RS ECC decoder of FIG. 3. In the illustrated embodiment, there is an additional syndrome generating component 402 that was part of the BMA component of FIG. 3. The syndrome generating component 402 produces syndromes based on a decision-codeword, and the BMA algorithm component 404 uses the syndromes to produce error indicators for the decision-codeword. The error indicators can be communicated to the CS/EEC component 406 where the Chien search can determine its validity. The error indicators can also be communicated to the list decoding component 408 for use in iterative decoding. Also for iterative decoding, the list decoding component 408 can receive syndromes from the syndrome generating component 402 or the BMA algorithm component 404.

If the CS/EEC component 406 determines that the error indicator from the BMA algorithm component 404 is invalid, it can provide a notification to a control circuit 414 in the soft-information component 410. In response, the control circuitry 414 can initiate the list decoding component. The soft-information component 410 can contain an internal memory 412 or, alternatively, can communicate with an external memory (not shown) for access to soft-information. The memory 412 can contain incidence vectors that correspond to combinations of symbol errors and next-most-likely values that provide alternative values for the symbols. In one embodiment, the control circuitry 414 can communicate an individual incidence vector and its corresponding next-most-likely value(s) to the list decoding component 408. In response, the list decoding component 408 can generate a modified decision-codeword based on the incidence vector and the next-most-likely value(s). In one embodiment, the soft-information component 410 can generate the modified decision-codeword and can communicate it to the list decoding component 408. If the list decoding component 408 identifies any potentially valid error indicators, it can communicate them to the soft-information component 410 for storage in the memory 412. After a predetermined number or all of the incidence vectors have been processed, the soft-information component 410 can communicate the error indicators in the memory 412, if any, to the CS/EEC component 406 for a Chien search and, if appropriate, for error evaluation and correction.

Figure 5:
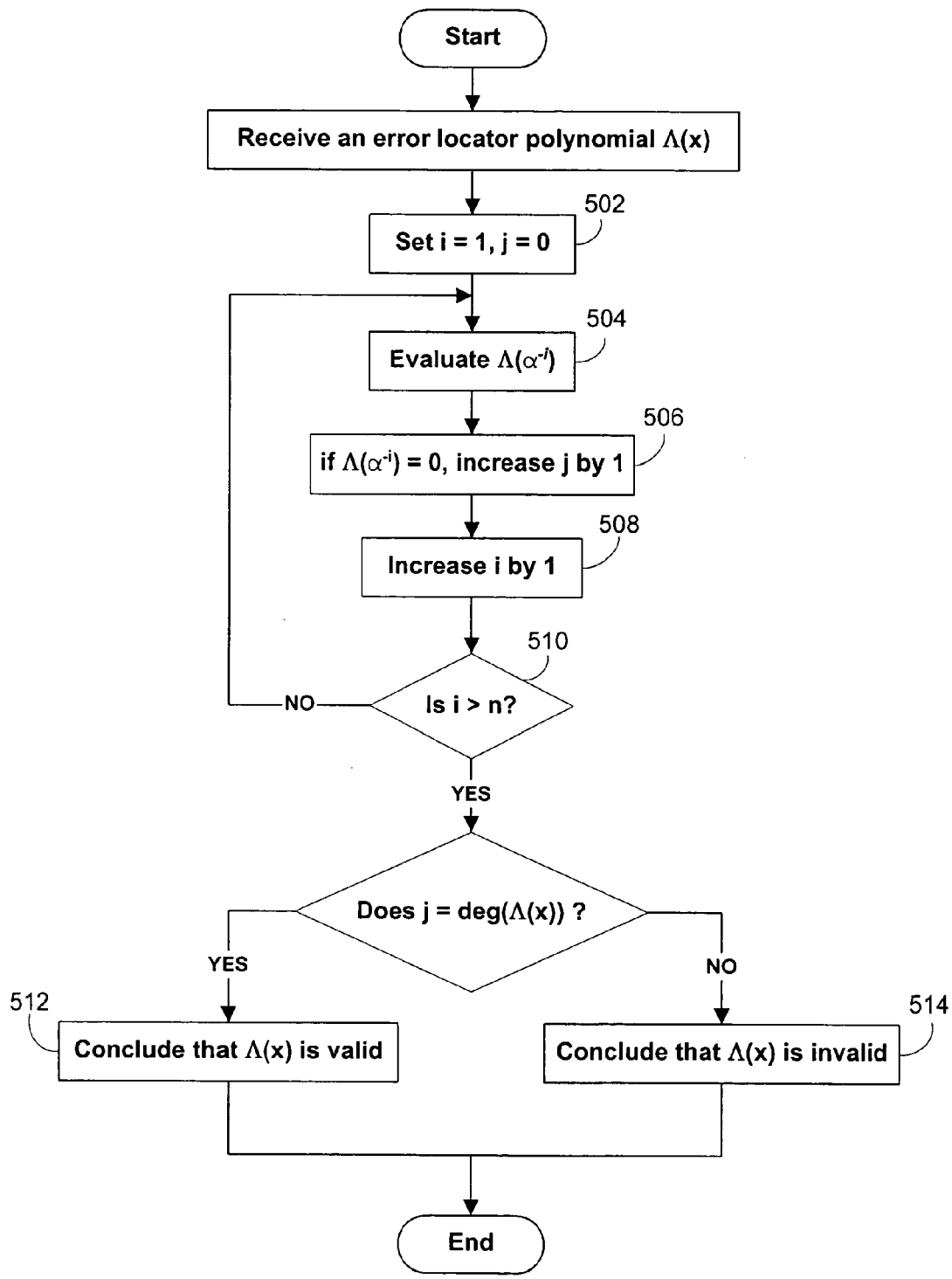
FIG. 5 is a flow diagram of an exemplary Chien search operation.

As previously described herein and in the Burd reference, the Chien search can be applied to error indicators generated by the BMA algorithm or by list decoding. The error indicators generated by the BMA algorithm or by list decoding can include an error locator polynomial $\Lambda(x)$, which, when valid, can be used to correct errors in a decision-codeword. Referring to FIG. 5, a Chien search can determine whether an error locator polynomial $\Lambda(x)$ is valid by identifying the roots of $\Lambda(x)$ and then comparing the number of distinct roots to the degree of $\Lambda(x)$. In one embodiment as shown in FIG. 5, the Chien search determines the roots of $\Lambda(x)$ by evaluating $\Lambda(x)$ at values $x=\alpha^{-i}$ for $i=0, \ldots, (n-1)$, where n is the number of symbols in a RS decision-codeword, and $\alpha$ is a primitive element in the Galois field over which the Reed-Solomon code is defined 502-510. The error locator polynomial is said to be "valid" if the number of distinct roots equals the degree of $\Lambda(x)$ 512. Otherwise, it is said to be invalid 514.

Importantly, a valid error locator polynomials means that the decision-codeword lies within a sphere of radius t of some valid RS ECC codeword, and, therefore, all of the errors in the decision-codeword can be corrected. Denoting the error locator polynomial generally as $\Lambda(x)=\Lambda_0+\Lambda_1 x+\Lambda_2 x^2+\ldots+\Lambda_v x^v$, the degree of $\Lambda(x)$ is v. For a valid error locator polynomial, there are then v distinct roots that correspond to v erroneous symbols in the decision-codeword. Since a valid error locator polynomial means that the number of erroneous symbols is less than or equal to t, it must be that $v \leq t$.

The roots of a valid error locator polynomial can be used to identify the location of errors in a decision-codeword. Specifically, for a root $x=\alpha^{-i}$, the value of i indicates that the symbol at location i in the decision-codeword is erroneous. Recognizing that the value of an erroneous symbol $v_i$ is the sum of a correct symbol value $c_i$ and an error value $e_i$, i.e., $v_i=(c_i+e_i)$, the error in symbol i can be corrected by computing $e_i$ using the Forney algorithm or another error evaluation technique and then computing $c_i=(v_i-e_i)$. The following paragraphs describe the Forney algorithm and other techniques for computing an error value $e_i$.

The Forney algorithm is a technique for computing error values based on a valid error locator polynomial and a syndrome polynomial. As described in the Burd reference, a Reed-Solomon code RS(n,k) can be defined based on a generator polynomial G(x) that has roots $\alpha^b, \alpha^{b+1}, \ldots, \alpha^{b+2t-1}$, where b is a constant value. Based on such a Reed-Solomon code, the syndrome polynomial is $S(x)=S_b+S_{b+1}x+S_{b+2}x^2+\ldots+S_{b+2t-1}x^{2t-1}$. The Forney algorithm computes an intermediate polynomial called an error evaluator polynomial $\Omega(x)$, which is defined as $\Omega(x)=S(x)\Lambda(x) \mod x^{2t}$. As previously described herein, the degree v of $\Lambda(x)$ is in the range $1 \leq v \leq t$ (assuming S(x) is not a zero polynomial). Since the degree of S(x) is at most 2t−1, the degree of $S(x)\Lambda(x)$ falls within the range [0, 3t). Because of the mod $x^{2t}$ operation in $\Omega(x)$, it can be seen that the resulting degree of $\Omega(x)$ must be less than 2t and is actually (v−1). Accordingly, if $\Lambda(x)$ is valid, then the error evaluator polynomial $\Omega(x)$ does not contain any terms $x^{v+j-1}$ for $j=1, \ldots, (2t-v)$. In other words, the coefficients of the terms $x^{v+j-1}$ are zero and need not be computed.

Based on these observations, the coefficients of an error-evaluator polynomial $\Omega(x)$ can be computed as follows:

$$\Omega_0 = S_b$$
$$\Omega_1 = S_{b+1} + S_b \Lambda_1$$
$$\Omega_2 = S_{b+2} + S_{b+1}\Lambda_1 + S_b\Lambda_2$$
$$\vdots$$
$$\Omega_{v-1} = S_{b+v-1} + S_{b+v-2}\Lambda_1 + \ldots + S_b\Lambda_{v-1}$$

The complexity of computing the error evaluator polynomial coefficients includes $\Lambda;2(v-1)(v-2)\approx\Lambda;2v^2$ multiply-accumulate operations.

Based on an error evaluator polynomial $\Omega(x)$ and an error locator polynomial $\Lambda(x)$, the error magnitude $e_i$ corresponding to symbol location i can be computed by:

$$e_i = \frac{X_i^{2-b}\Omega(X_i^{-1})}{\Lambda'(X_i^{-1})}, \quad (EQ7)$$

where $X_i = \alpha^i$, and where $\Lambda'(x)$ is the formal derivative of the error locator polynomial $\Lambda(x)$:

$$\Lambda'(x) = \sum_{j=1}^{v} j\Lambda_j x^{j-1}. \quad (EQ8)$$

Using equation EQ7, the computation of error values $e_i$ for v erroneous symbols includes $2v^2$ multiplications.

In one embodiment of the Forney algorithm, the computation of error values $e_i$ can be further simplified by observing that $$e_i = \frac{X_i^{2-b}\Omega(X_i^{-1})}{\Lambda'(X_i^{-1})} = \frac{X_i^{1-b}\Omega(X_i^{-1})}{X_i^{-1}\Lambda'(X_i^{-1})}. \quad (EQ9)$$

Recognizing that the denominator can be equivalently expressed as:

$$x\Lambda'(x) = \sum_{j=1}^{v} j\Lambda_j x^j = \sum_{j=1,odd}^{v} \Lambda_j x^j, \quad (EQ10)$$

we can define $\overline{\Lambda}(x)$ to be the quantity $$\sum_{j=1,odd}^{v} \Lambda_j x^j.$$

Then, the error magnitude $e_i$ can be expressed as:

$$e_i = \frac{X_i^{1-b}\Omega(X_i^{-1})}{\overline{\Lambda}(X_i^{-1})}. \quad (EQ11)$$

It can be seen that the terms in $\overline{\Lambda}(x)$ are a subset of the terms in $\Lambda(x)$, so that $\overline{\Lambda}(\alpha^{-i})$ can be computed as part of the Chien search computation of $\Lambda(\alpha^{-i})$ without any additional effort. The computation of $\Omega(\alpha^{-i})$, however, is separate from the Chien search computations.

Figures 6, 7:
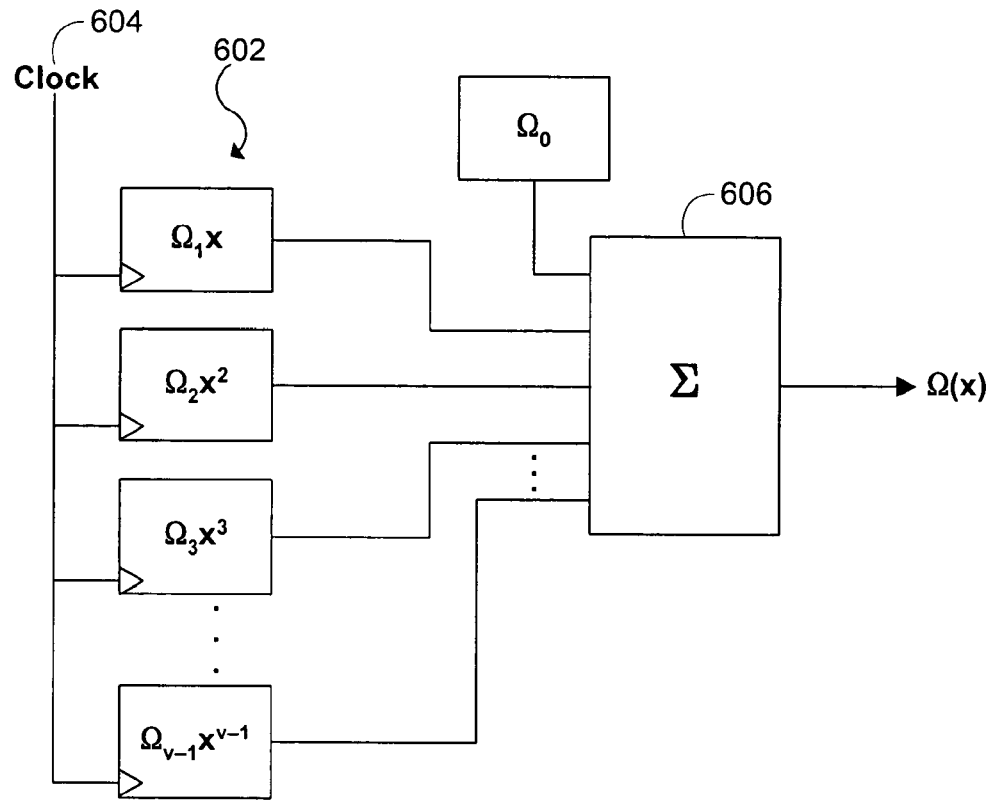
FIG. 6 is a block diagram of an exemplary architecture for evaluating an error evaluator polynomial.
FIG. 7 is a table showing an exemplary evaluation of an error evaluator polynomial over multiple cycles of a clock signal based on the architecture of FIG. 6.

Referring now to FIG. 6, there is shown a block diagram of an architecture 600 for evaluating an error evaluator polynomial. The illustrated architecture 600 includes one computation block for each term in the error evaluator polynomial. The computation blocks 602 can operate in parallel and are timed by a clock signal 604. The results from the computation blocks 602 are connected to a summation block 606 that computes the sum of these results. The resulting summation is the value of $\Omega(x)$ evaluated at a value $x = \alpha^{-i}$, which corresponds to a symbol location i.

With reference also to the table in FIG. 7, each cycle of the clock signal can trigger the architecture to evaluate $\Omega(x)$ for a different symbol location. Specifically, the architecture can compute $\Omega(\alpha^0)$ during a first clock cycle, $\Omega(\alpha^{-1})$ during a second clock cycle, and so on. In this manner, the error evaluator polynomial $\Omega(x)$ can be evaluated for n symbol locations in n cycles.

Figures 8, 9:
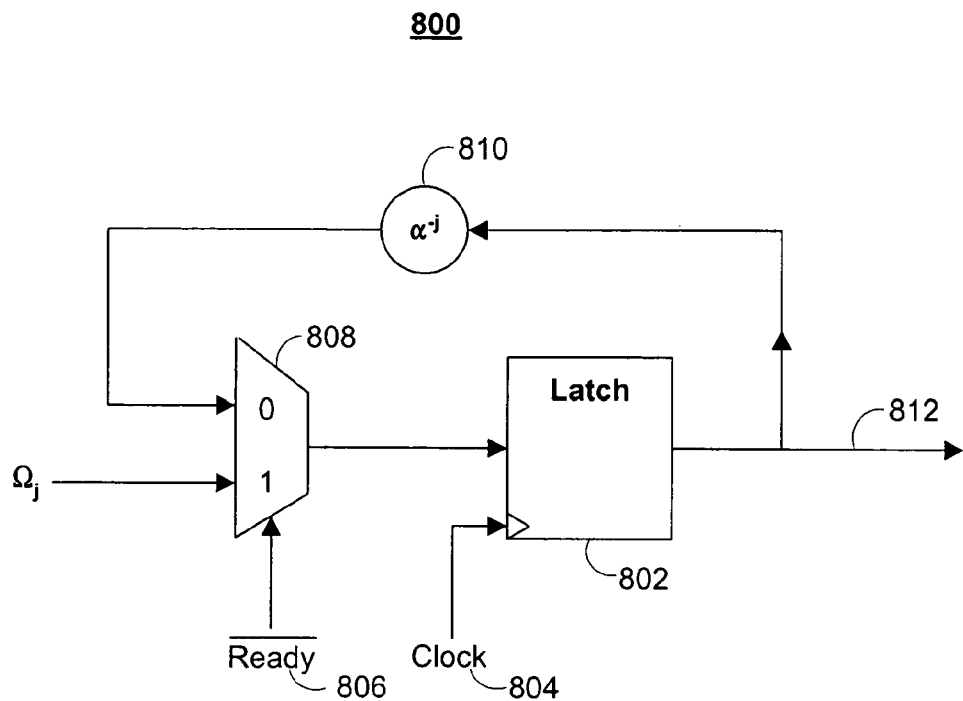
FIG. 8 is a circuit diagram of an exemplary component for computing a term of an error evaluator polynomial in the architecture of FIG. 6.
FIG. 9 is a table showing an exemplary evaluation of a term of an error evaluator polynomial over multiple cycles of a clock signal based on the circuit of FIG. 8.

Referring to FIG. 8, there is shown a circuit implementation of a computation block for computing a term $\Omega_j(x)^j$, where j is constant. The circuit 800 includes a latch 802 that is timed by a clock signal 804, which is the same as the clock signal 604 of FIG. 6. The circuit 800 can operate in two modes based on a signal $\overline{READY}$ 806. In a first mode, when $\overline{READY}=1$, the value $\Omega_j$ at the "one" input of the multiplexer 808 is stored in the latch 802 at the beginning of each clock cycle. For example, if the computation block corresponds to j=1, then the value $\Omega_1$ is stored in the latch 802. In the second mode, when $\overline{READY}=0$, the circuit 800 operates in an iterative configuration, and the value at the "zero" input of the multiplexer 808 is stored in the latch 802 at the beginning of each clock cycle. The value at the "zero" input is the product of $\alpha^{-j}$ with the value stored in the latch 802. This product can be computed by a finite-field multiplier 810. In the iterative mode, the circuit 800 operates to compute the term $\Omega_j(x)^j$ at a value $x = \alpha^{-i}$ for a different symbol location i during each cycle, as shown in the table in FIG. 9. When the signal $\overline{READY}$ changes from one to zero, the value at the "zero" input of the multiplexer 810 is $\Omega_j(\alpha^{-1})^j$, which corresponds to symbol location i=1. At the beginning of a first cycle after signal $\overline{READY}$ 806 changes to zero, the value $\Omega_j(\alpha^{-1})^j$ is stored in the latch 802. During the first cycle, the feedback path multiplies $\Omega_j(\alpha^{-1})^j$ with $\alpha^{-j}$ to produce the value $\Omega_j(\alpha^{-2})^j$ at the "zero" input of the multiplexer 808. This value corresponds to symbol location i=2. Then, at the beginning of a second cycle, the value $\Omega_j(\alpha^{-2})^j$ is stored in the latch 802. In this manner, the circuit 800 computes the values $\Omega_j(\alpha^{-i})^j$ for i=1, ..., n-1 during n-1 cycles. For example, if j=1, the circuit 800 computes the value $\Omega_1(\alpha^{-1})$ during a first cycle, the value $\Omega_1(\alpha^{-2})$ during a second cycle, and so on. During each cycle, the output value 812 of the circuit is communicated to a summation block, such as the summation block 606 of FIG. 6, where it is used to compute $\Omega(\alpha^{-i})$.

The embodiments of FIGS. 6-9 are exemplary, and other embodiments are contemplated. For example, although not shown, an architecture for evaluating an error evaluator polynomial can be a pipelined architecture.

Figure 10:
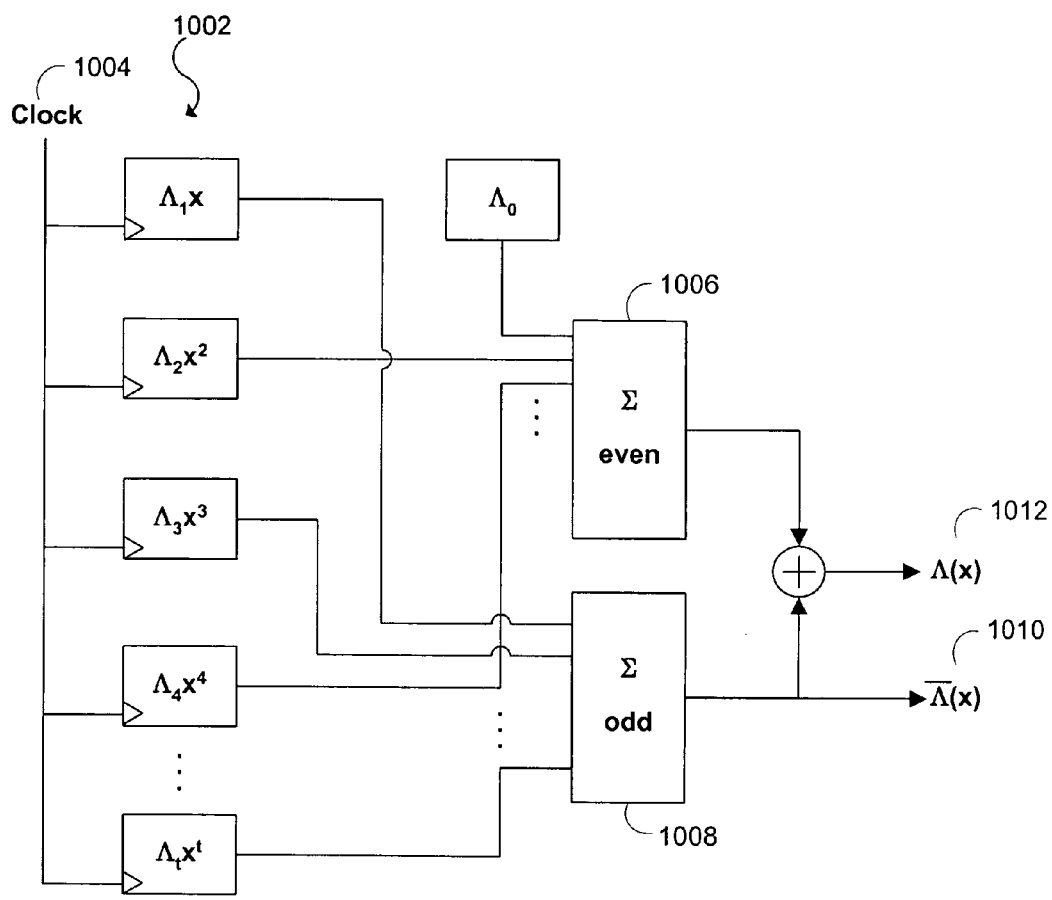
FIG. 10 is a block diagram of an exemplary architecture for evaluating an error locator polynomial.

Referring now FIG. 10, there is shown a block diagram of an architecture 1000 for evaluating an error locator polynomial. The illustrated architecture 1000 includes one computation block for each term in the error locator polynomial. The computation blocks 1002 can operate in parallel and are timed by a clock signal 1004. The results from the computation blocks 1002 are connected to summation blocks 1006, 1008 that compute the sum of these results. In the illustrated embodiment, one summation block 1006 computes the sum of results from computation blocks that compute terms $\Lambda_j(x)^j$ corresponding to even values of j, and the other summation block 1008 computes the sum of results from computation blocks that computes terms $\Lambda_j(x)^j$ corresponding to odd values of j. The summation of terms $\Lambda_j(x)^j$ for odd values of j computes the polynomial $\overline{\Lambda}(x)$ 1010 previously defined herein. The results of the odd and even summation blocks 1006,1008 are then summed together to provide the value of $\Lambda(x)$ 1012 evaluated at a value $x=\alpha^{-i}$ corresponding to a symbol location i. As shown by this architecture, the polynomial $\overline{\Lambda}(x)$ is evaluated as part of the evaluation of $\Lambda(x)$.

Figure 11:
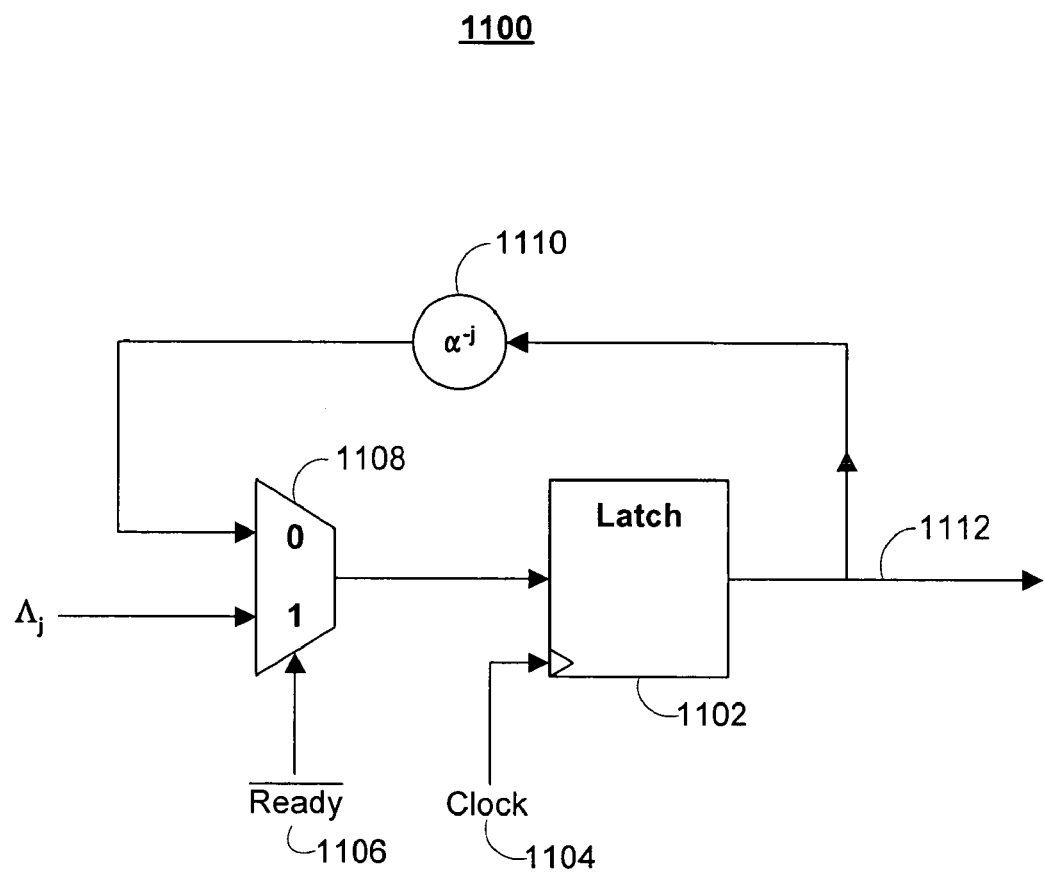
FIG. 11 is a circuit diagram of an exemplary component for computing a term of an error locator polynomial in the architecture of FIG. 10.

FIG. 11 is a diagram of a circuit implementation of a computation block for computing a term $\Lambda_j(x)^j$, where j is constant. The circuit 1100 includes a latch 1102 that is timed by a clock signal 1104, which is the same as the clock signal 1004 of FIG. 10. The circuit 1100 can operate in two modes based on a signal $\overline{\text{READY}}$ 1106. In a first mode, when $\overline{\text{READY}}$=1, the value $\Lambda_j$ at the "one" input of the multiplexer 1108 is stored in the latch 1102 at the beginning of each clock cycle. For example, if the computation block corresponds to j=1, then the value $\Lambda_1$ is stored in the latch 1102. In the second mode, when $\overline{\text{READY}}$=0, the circuit 1100 operates in an iterative configuration, and the value at the "zero" input of the multiplexer 1108 is stored in the latch 1102 at the beginning of each clock cycle. The value at the "zero" input is the product of $\alpha^{-j}$ with the value stored in the latch 1102. This product can be obtained using a finite-field multiplier 1110. In the iterative mode, the circuit 1100 operates to compute the term $\Lambda_j(x)^j$ at a value $x=\alpha^{-i}$ for different symbol locations i. When the signal $\overline{\text{READY}}$ 1106 changes from one to zero, the value at the "zero" input of the multiplexer 1108 is $\Lambda_j(\alpha^{-1})^j$, which corresponds to symbol location i=1. At the beginning of a first cycle after signal $\overline{\text{READY}}$ 1106 changes to zero, the value $\Lambda_j(\alpha^{-1})^j$ is stored in the latch 1102. During the first cycle, the feedback path multiplies $\Lambda_j(\alpha^{-1})^j$ with $\alpha^{-j}$ to produce the value $\Lambda_j(\alpha^{-2})^j$ at the "zero" input of the multiplexer 1108. This value corresponds to symbol location i=2. Then, at the beginning of a second cycle, the value $\Lambda_j(\alpha^{-2})^j$ is stored in the latch 1102. In this manner, the circuit 1100 computes the values $\Lambda_j(\alpha^{-i})^j$ for i=1, . . . , n during n cycles. During each cycle, the output value 1112 of the circuit 1100 is communicated to a summation block, such as the even summation block 1006 or the odd summation block 1008 of FIG. 10, and is ultimately used to compute the value $\Lambda(\alpha^{-i})$.

Figure 12:
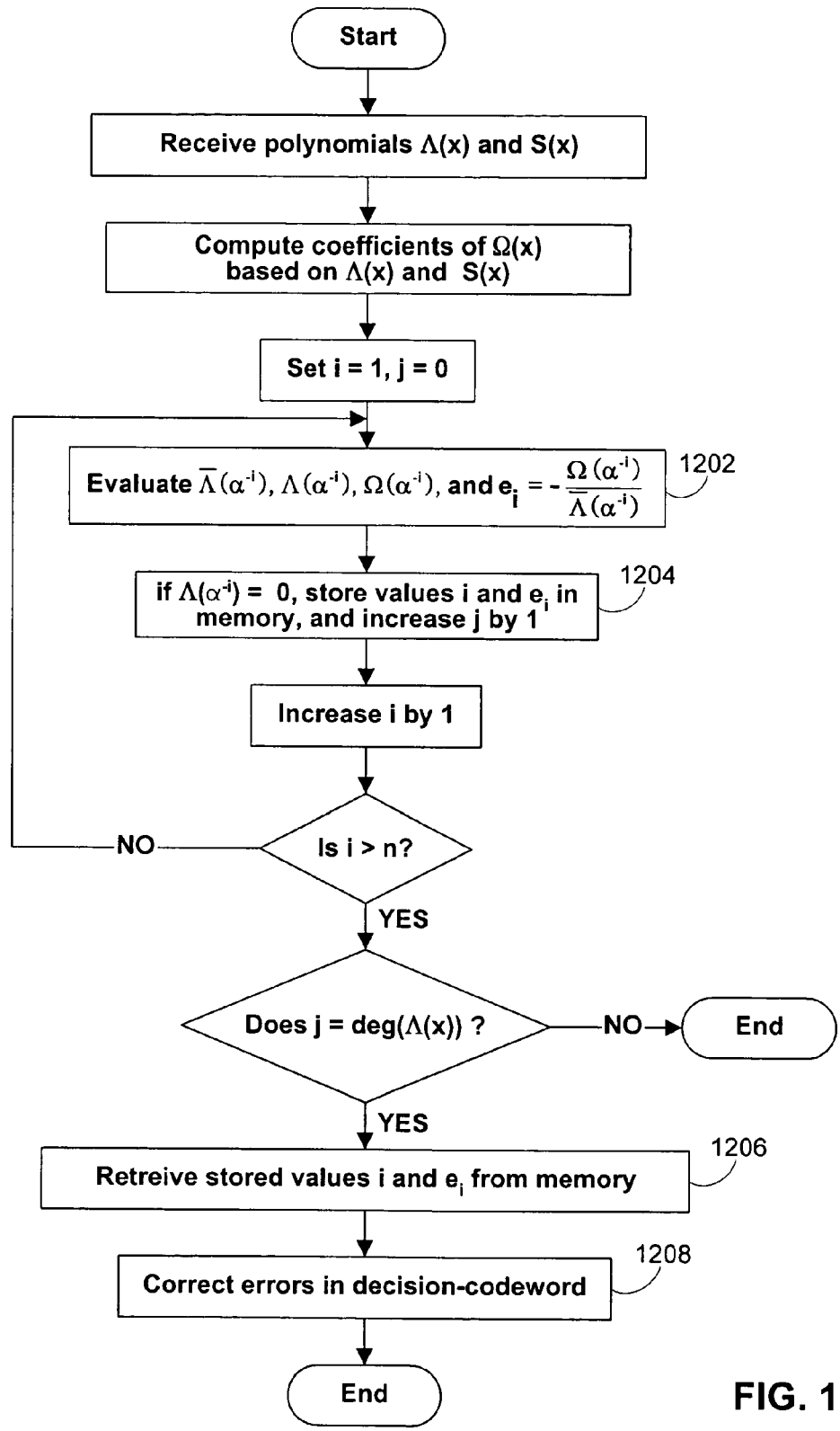
FIG. 12 is a flow diagram of an exemplary method for concurrently performing Chien search and error evaluation.

Referring now to FIG. 12, there is shown a flow diagram of one method for identifying and correcting errors in a decision-codeword. The illustrated method operates in the same manner as the Chien search of FIG. 5 for determining the validity of an error locator polynomial $\Lambda(x)$. However, rather than computing error values $e_i$ after the Chien search, the method of FIG. 12 evaluates the error values concurrently with the Chien search computations. At the same time that the values $\overline{\Lambda}(\alpha^{-i})$ and $\Lambda(\alpha^{-i})$ are computed, the value $\Omega(\alpha^{-i})$ can also be evaluated. The value $\Omega(\alpha^{-i})$ can be computed, for example, using the circuits and timings shown in FIGS. 6-9, and the values $\overline{\Lambda}(\alpha^{-i})$ and $\Lambda(\alpha^{-i})$ can be computed, for example, using the circuits and timings shown in FIGS. 10-11. Based on those resulting values, the error value $e_i$ can be computed using equation EQ11 1202. Then, if $\Lambda(\alpha^{-i})$=0, the symbol location i and the error value $e_i$ can be stored in a memory 1204. At the end of the Chien search, if it is determined that $\Lambda(x)$ is valid, the stored symbol locations and error values can be retrieved from memory 1206 for use in correcting the erroneous symbols 1208. Otherwise, if $\Lambda(x)$ is not valid, then the stored symbol locations and error values can be discarded or overwritten.

In cases where an error locator polynomial $\Lambda(x)$ is determined to be invalid, the Burd reference and co-pending application Ser. No. 11/195,183 describe list decoding and iterative decoding techniques that can be used to decrease the number of errors in a decision-codeword. List decoding and iterative decoding can produce several candidate modified decision-codewords that may contain a decreased number of symbol errors. As before, a Chien search can be used to determine whether a modified decision-codeword can be corrected by determining whether its corresponding error locator polynomial is valid. Several Chien searches may need to be performed before a valid error locator polynomial can be identified.

Figure 13:
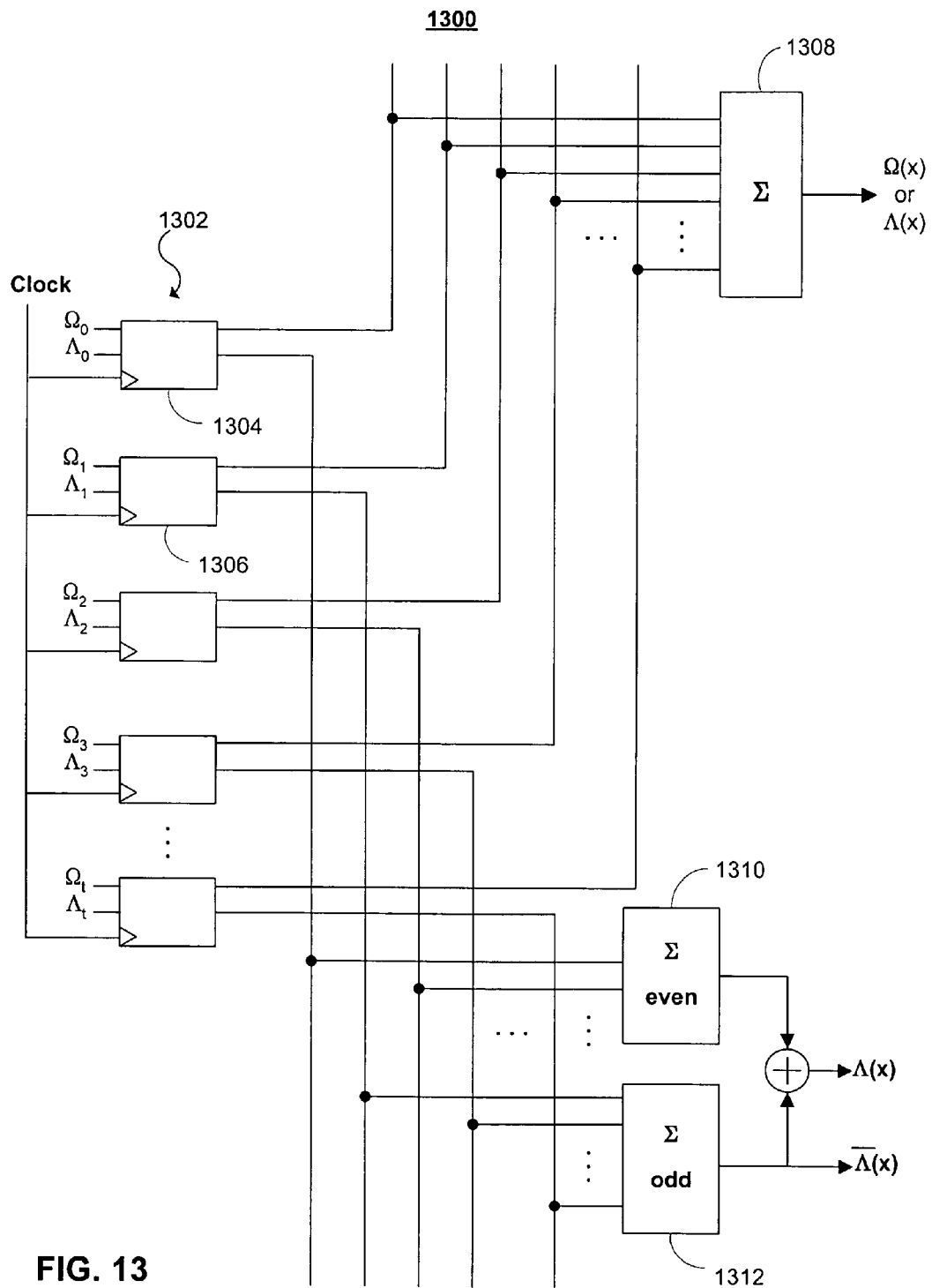
FIG. 13 is a block diagram of an exemplary hybrid architecture that can operate in a concurrent Chien search and error evaluation mode and an accelerated Chien search mode.

In accordance with one aspect of the disclosed invention and with reference to FIG. 13, error identification and correction can be performed using a hybrid architecture 1300 that can perform Chien search and error evaluation concurrently in one mode (in accordance with FIG. 12) and that can perform a Chien search without error evaluation in a second mode (in accordance with FIG. 5). In the second mode, rather than having the error evaluation circuitry remain idle during the Chien search, the hybrid architecture uses the error evaluation circuitry to perform Chien search computations, thereby decreasing the amount of time required to perform the Chien search. Accordingly, the first mode will be referred to herein as "concurrent mode" and the second mode will be referred to herein as an "accelerated Chien search." In the illustrated embodiment, the hybrid architecture includes (t+1) computation blocks 1302 that each include two inputs, two outputs, and a clock signal connection. For any particular computation block, one input is an error evaluator polynomial coefficient $\Omega_m$ and one input is an error locator polynomial coefficient $\Lambda_j$, where the values m and j can be the same or different. For ease of explanation, FIG. 13 is configured so that the values of m and j that are assigned to each computation block are the same. For example, the first computation block 1304 has input values $\Omega_0$ and $\Lambda_0$ (m=j=0), the next computation block 1306 has input values $\Omega_1$ and $\Lambda_1$ (m=j=1), and so on. Embodiments of configurations where m and j are not the same will be explored later herein. The computation blocks 1302 each have two output values, which will be referred to herein as a "top" output value and a "bottom" output value. The top output values from the computation blocks are connected to a summation block 1308. The top output values correspond to different polynomial terms in the first mode and in the second mode. In the first mode, the top output values correspond to the terms $\Omega_m x^m$ in an error evaluator polynomial. Accordingly, in the first concurrent mode, the result of the summation block 1308 is the value of $\Omega(x)$ at a value $x=\alpha^{-i}$. In the second accelerated Chien search mode, the top output values correspond to the terms $\Lambda_j x^j$ in an error locator polynomial. Thus, in the second mode, the result of the summation block 1308 is the value of $\Lambda(x)$ at a value $x=\alpha^{-i}$. In contrast, the bottom output values do not change between the two modes and correspond to the terms $\Lambda_j x^j$ in both modes. The bottom output values from computation blocks that correspond to even values of j are connected to an "even" summation block 1310, and the bottom output values from computation blocks that correspond to odd values of j are connected to an "odd" summation block 1312. The odd summation block 1312 computes the value of $\overline{\Lambda}(x)$ at a value $x=\alpha^{-i}$. The results of the odd summation block 1312 and the even summation block 1310 are added together to compute the value of $\Lambda(x)$ at a value $x=\alpha^{-i}$.

The illustrated architecture of FIG. 13 is exemplary and variations are contemplated. For example, the top summation block 1308 for the top outputs can be replaced by odd and even summation blocks, like those shown 1310,1312 for the bottom outputs. In such an architecture, the top output values from computation blocks that correspond to even values of m can be connected to an "even" summation block (not shown), and the top output values from computation blocks that correspond to odd values of m can be connected to an "odd" summation block (not shown). The results of the odd summation block and the even summation block can be added together to compute the value of either $\Omega(x)$ or $\Lambda(x)$ at a value $x=\alpha^{-i}$.

Figure 14:
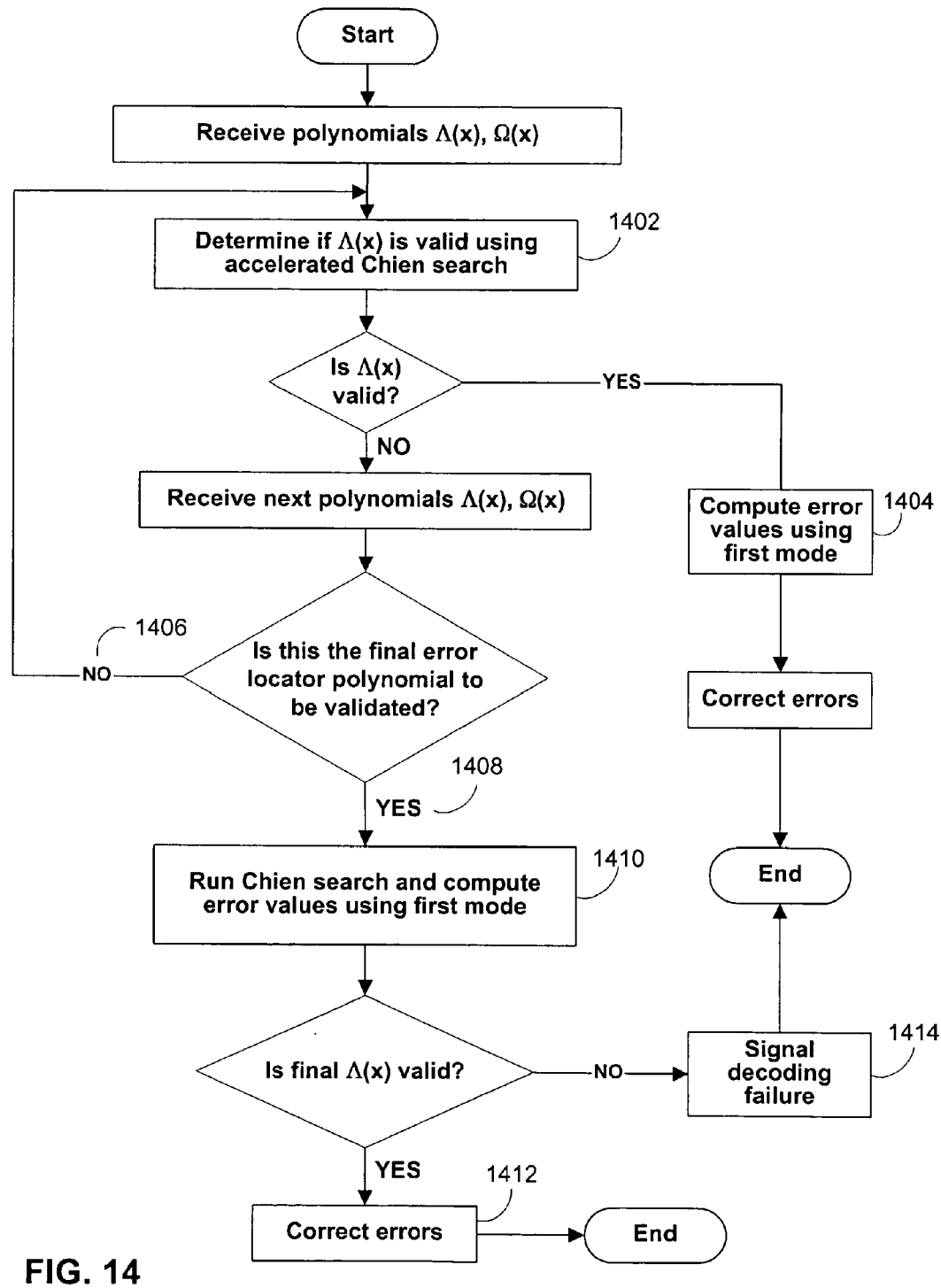
FIG. 14 is a flow diagram of an exemplary method for performing error evaluation and correction on multiple error locator polynomials using the hybrid architecture of FIG. 13.

FIG. 14 shows a flow diagram illustrating one exemplary method for using the hybrid architecture 1300 of FIG. 13 to perform error evaluation and correction for multiple error locator polynomials. Assuming there are a number m of error locator polynomials where m>1, an accelerated Chien search can be performed for a first error locator polynomial 1402. If the error locator polynomial is valid, then a concurrent Chien search and error evaluation can be performed for the valid error locator polynomial 1404. In this case, a Chien search is performed again to compute the values $\overline{\Lambda}(\alpha^{-i})$, which are needed to compute the error values $e_i$. If the error locator polynomial is not valid and there is more than one error locator polynomial that has not been validated 1406, then an accelerated Chien search can be performed for another error locator polynomial 1402 to determine if it is valid, and so on and so forth. In the situation where (m−1) error locator polynomials have all been found to invalid and only one error locator polynomial remains to be validated 1408, a concurrent Chien search and error evaluation can be performed for the final error locator polynomial 1410. If this final error locator polynomial is determined to be valid, then the computed error values can be used for error correction 1412. Otherwise, the hybrid architecture can signal a decoding failure 1414.

Figure 15:
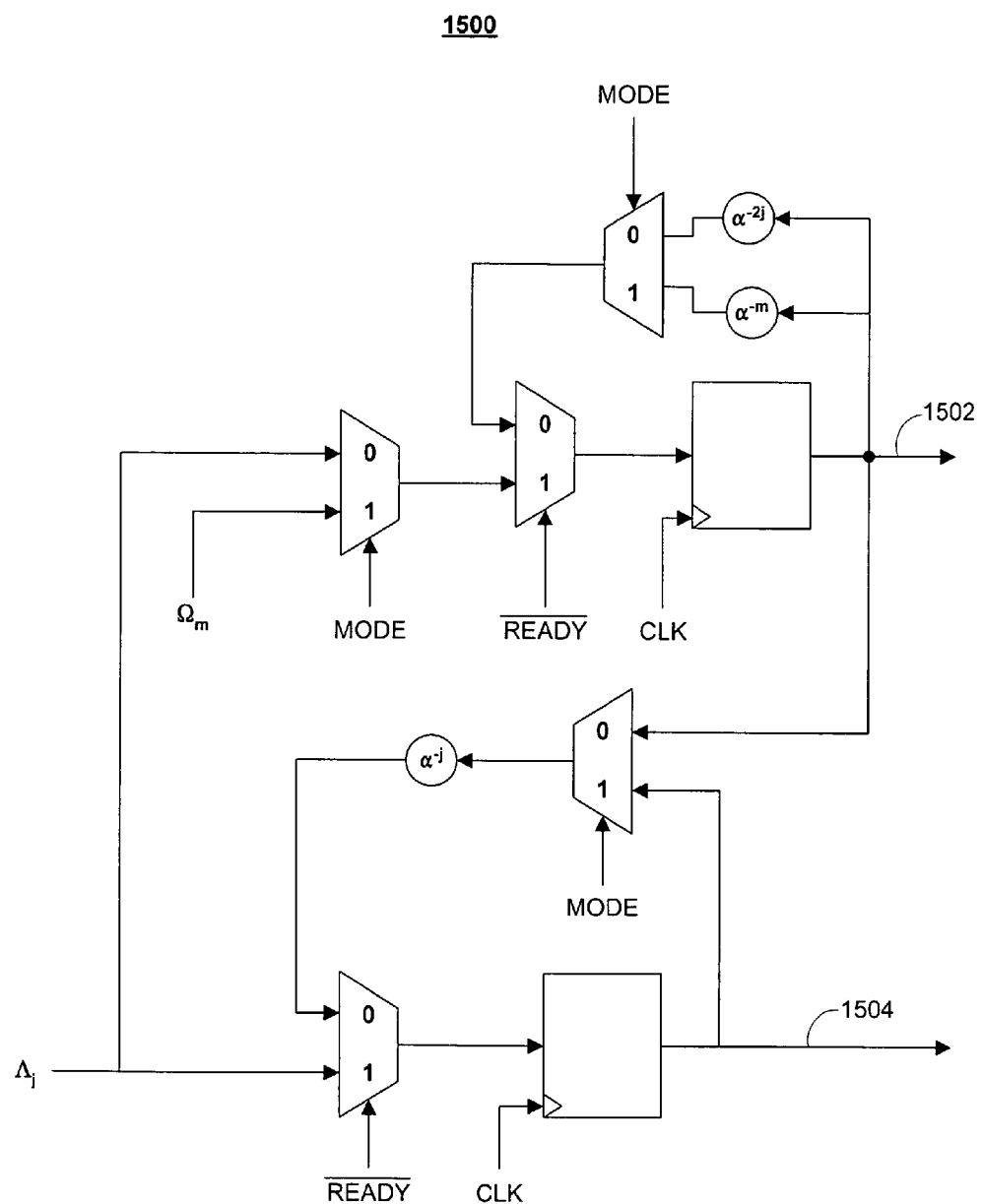
FIG. 15 is a circuit diagram of a computation component in the hybrid architecture of FIG. 13.
Figure 16:
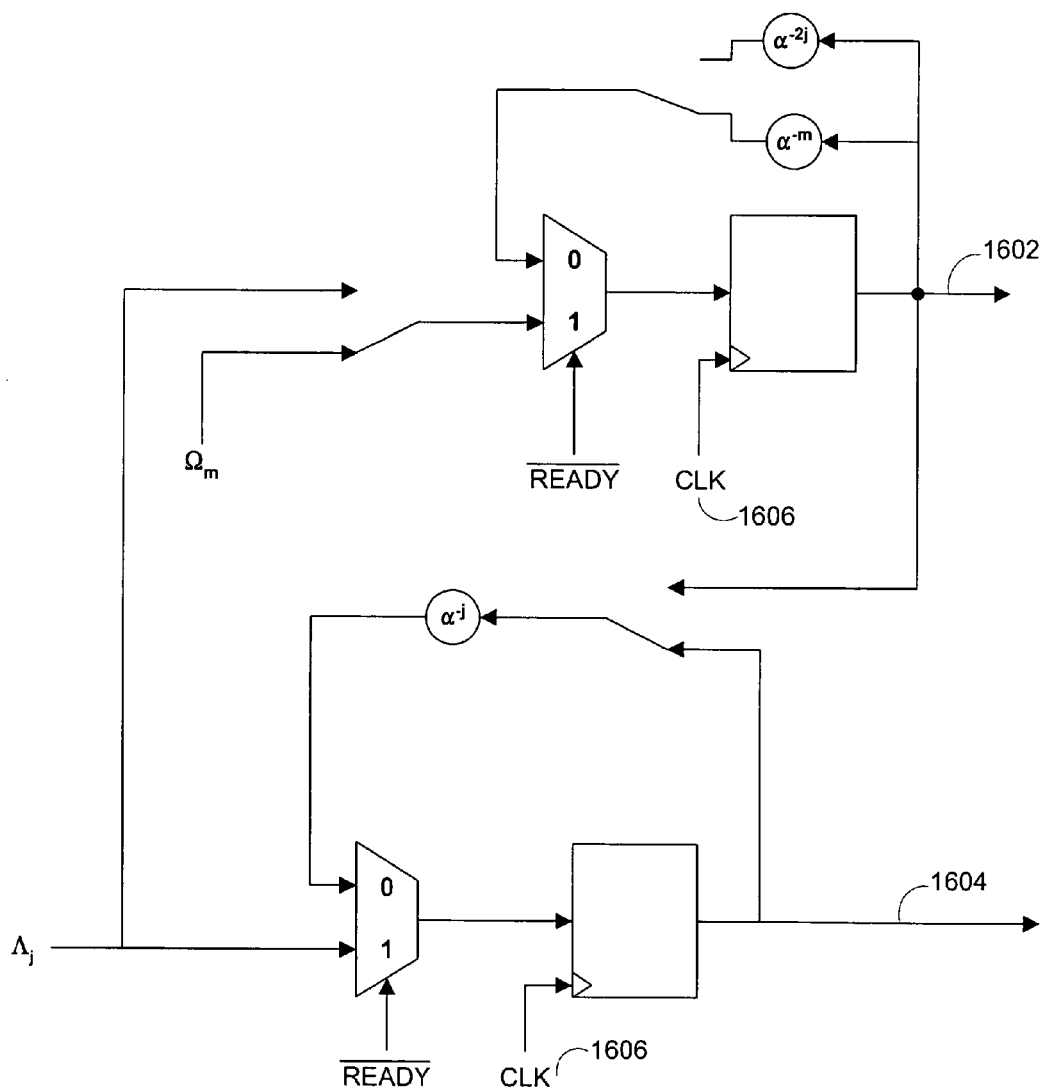
FIG. 16 is a diagram of the circuit of FIG. 13 when operating in concurrent Chien search and error evaluation mode.
Figure 17:
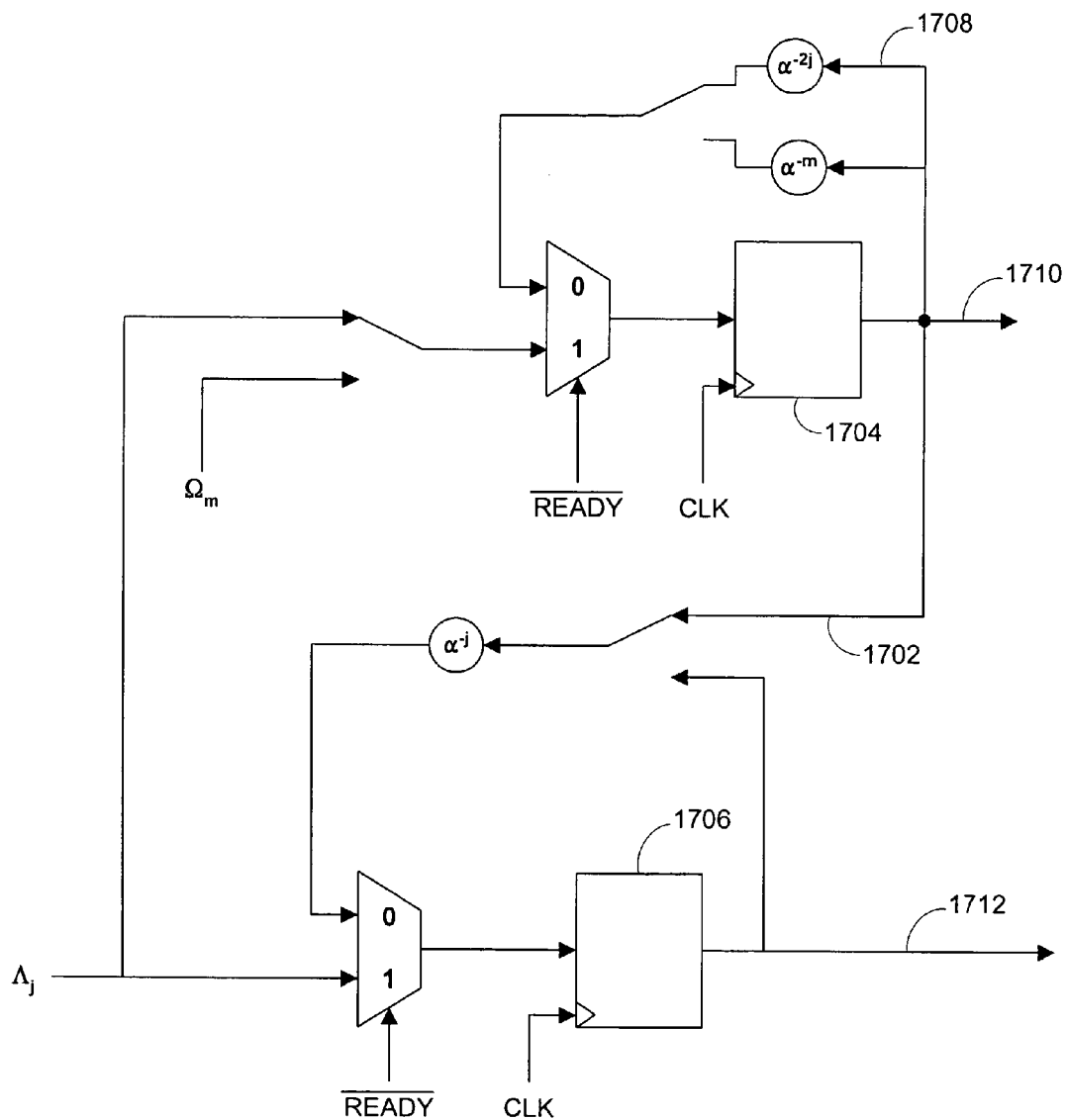
FIG. 17 is a diagram of the circuit of FIG. 13 when operating in accelerated Chien search mode.

Referring now to FIG. 15, there is shown a circuit implementation of a computation block in the hybrid architecture of FIG. 13. The computation circuit 1500 receives input values $\Omega_m$ and $\Lambda_j$, and produces a top output value 1502 and a bottom output value 1504. The circuit 1500 can operate in two modes based on a signal MODE. The circuit configuration for MODE=1 is illustrated in FIG. 16. In this mode, the circuit 1500 performs Chien search and error evaluation concurrently. The circuit configuration for MODE=0 (accelerated Chien search mode) is illustrated in FIG. 17. In this mode, the circuit 1500 does not perform error evaluation. Rather, two values of $\Lambda_j(\alpha^{-i})^j$ are computed concurrently for two different values of i. Accordingly, the accelerated Chien search in MODE=0 is capable of completing the Chien search in half the time of the circuit 1500 operating in MODE=1.

FIG. 16 shows the circuit of FIG. 15 when the signal MODE has a logical value of one. For clarity, multiplexers that are controlled by the signal MODE have been replaced by their logical connections. In this configuration, it can be seen that the circuitry for generating the top output value 1602 is substantially the same as the computation circuit 800 of FIG. 8, and the circuitry for generating the bottom output value 1604 is substantially the same as the computation circuit 1100 of FIG. 11. Accordingly, the top output value 1602 corresponds to the values $\Omega_m(\alpha^{-i})^m$, where the value of i varies over different cycles of the clock signal. The bottom output value 1604 corresponds to the values $\Lambda_j(\alpha^{-i})^j$ where the value of i varies over different cycles of the clock signal 1606.

FIG. 17 shows the circuit of FIG. 15 when the signal MODE has a logical value of zero. For clarity, multiplexers that are controlled by the signal MODE have been replaced by their logical connections. In this configuration, it can be seen that when the signal $\overline{\text{READY}}$ has a logical value of zero, there is a communication path 1702 between the output of the top latch 1704 and the input of the bottom latch 1706, such that if the value at the output of the top latch 1704 is $\Lambda_j(\alpha^{-i})^j$, then the value at the input of the bottom latch 1706 is $\Lambda_j(\alpha^{-(i+1)})^j$. There is also a feedback path 1708 between the output of the top latch 1704 and the input of the top latch 1704 such that if the value at the output of the top latch is $\Lambda_j(\alpha^{-i})^j$, then the value at the input of the top latch is $\Lambda_j(\alpha^{-(i+2)})^j$. The values at the inputs to the latches can be stored in the latches at the beginning of the next clock cycle. In this manner, the computed top output values 1710 correspond to the values $\Lambda_j(\alpha^{-i})^j$ for even values of i, and the computed bottom output values 1712 correspond to the values $\Lambda_j(\alpha^{-i})^j$ for odd values of i, where i≦n. FIG. 18 shows a table of the contents of the top and bottom latches in relation to the signal $\overline{\text{READY}}$ and for different cycles of the clock signal.

Figure 19:
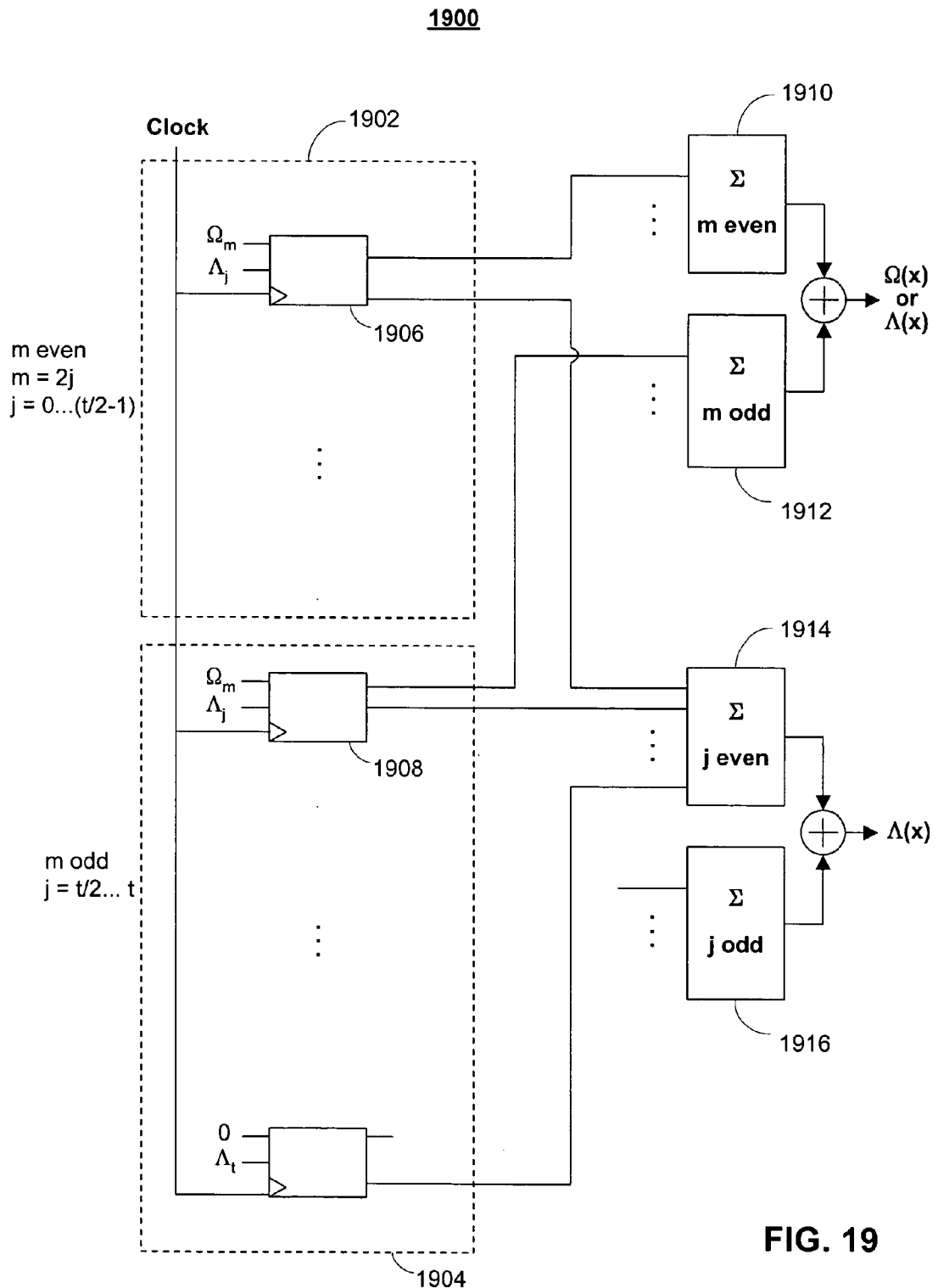
FIG. 19 is one variation of the exemplary hybrid architecture of FIG. 13.

Referring now to FIG. 19, there is shown a variation of the hybrid architecture of FIG. 13 in which the values of m and j assigned to each computation component are different (except for the case of m=j=0). As before, the hybrid architecture 1900 of FIG. 19 includes (t+1) computation components. In a top portion 1902 of the hybrid architecture, each computation component 1906 receives a pair of input values $\Omega_m$ and $\Lambda_j$ where j is one value from j=0, . . . , t/2-1, and m=2j. Accordingly, the computation components in the top portion 1902 correspond to the even values m=0, 2, 4, . . . , t−2. In a bottom portion 1904 of the hybrid architecture, each computation component 1908 receives a pair input values $\Omega_m$ and $\Lambda_j$ where j is one value from j=t/2, . . . , t, and where m is one value from the odd values m=1, 3, 5, . . . , t−1. In the bottom portion 1904, the particular assignment of values m and j to a particular computation component 1908 is inconsequential (as explained later herein) as long as the correct output lines are summed together. For the top output values, an even summation block 1910 computes the sum of top outputs that correspond to even values of m, and an odd summation block 1912 computes the sum of top outputs that correspond to odd values of m. The outputs of the even summation block 1910 and the odd summation block 1912 can be summed together to provide $\Omega(x)$ or $\Lambda(x)$ computed at a value $x=\alpha^{-i}$. For the bottom output values, an even summation block 1914 computes the sum of bottom outputs that correspond to even values of j, and an odd summation block 1916 computes the sum of bottom outputs that correspond to odd values of j. The outputs of the even summation block 1910 and the odd summation block 1912 can be summed together to provide $\Lambda(x)$ computed at a value $x=\alpha^{-i}$.

Figure 20:
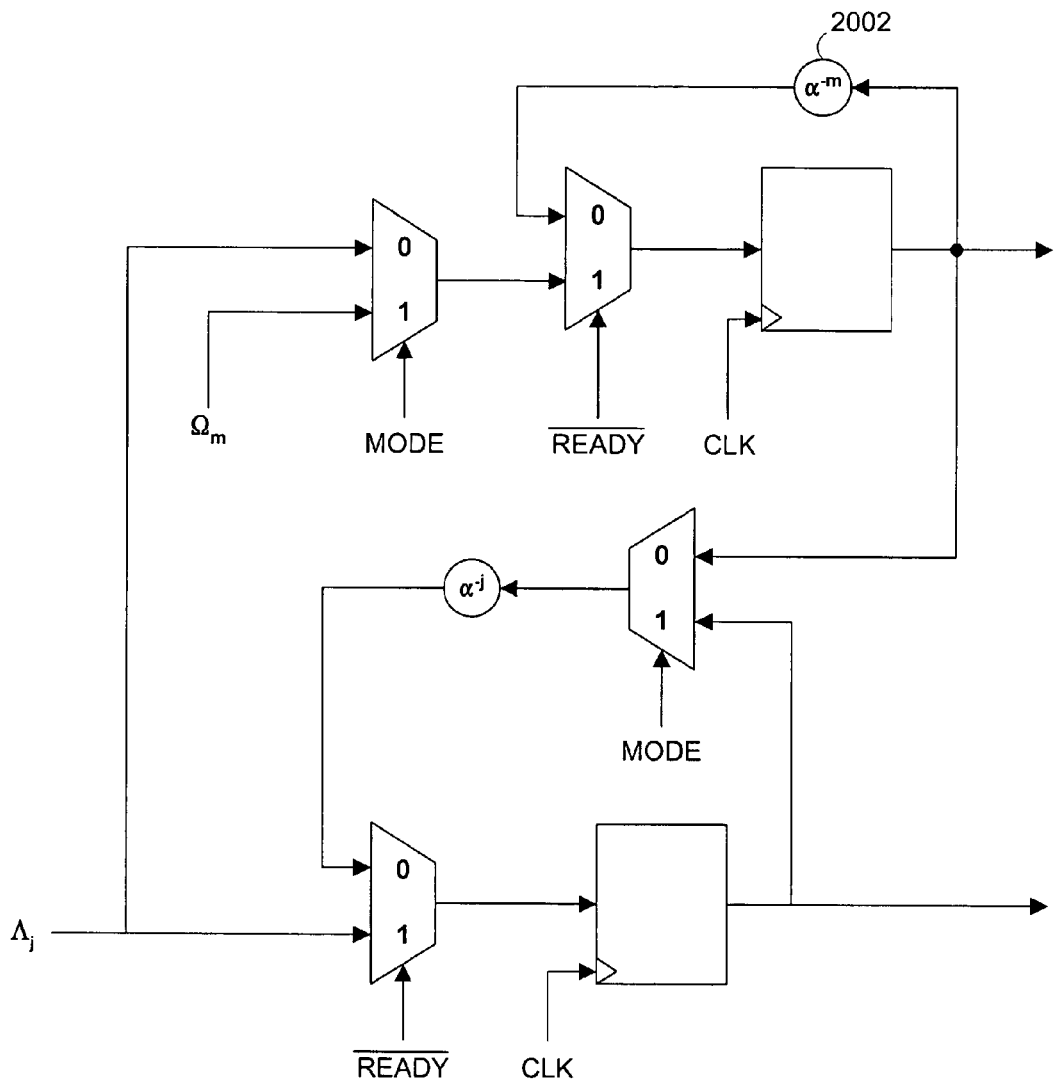
FIG. 20 is one variation of the circuit diagram of FIG. 15 that can be used in the hybrid architecture of computation of FIG. 19.

It can be seen that although the values of m and j assigned to any particular block may not be the same, the hybrid architecture 1900 is able to perform the same computations as the hybrid architecture 1300 of FIG. 13. Moreover, the hybrid architecture 1900 of FIG. 19 makes it possible to apply an improvement to the computation components 1906 in the top portion 1902 of the architecture. This improvement can be seen by reference to the circuits of FIGS. 15 and 20. As shown in FIG. 15, the output 1502 of the top latch can be fed back to the input of the top latch through one of the two multipliers $\alpha^{-m}$ and $\alpha^{-2j}$, as determined by a MODE signal. However, for the case where m=2j (such as in the top portion 1902 of the hybrid circuit 1900 of FIG. 19) the multipliers $\alpha^{-m}$ and $\alpha^{-2j}$ are the same and it becomes unnecessary to have both multipliers. Therefore, the circuit 1500 of FIG. 15 can be simplified by removing one of the multipliers and the top multiplexer, as shown by the circuit 2000 of FIG. 20, wherein only one multiplier 2002 is needed in both the (first) concurrent mode and the (second) accelerated Chien search mode. Accordingly, the computation circuitry 2000 of FIG. 20 can be used for the top computation components of FIG. 19, and the computation circuitry 1500 of FIG. 15 can be used for the bottom computation components of FIG. 19, thereby resulting in a savings in power and space over the hybrid architecture 1300 of FIG. 13.

What have been described thus far are methods, architectures, and circuits for identifying and correcting symbol errors in a decision-codeword using a Chien search and the Forney algorithm. The particular embodiments disclosed herein are illustrative and do not limit the scope of the disclosed invention. For example, the types and/or number of components, and/or their arrangement, orientation, interconnections, and/or configuration may be varied from those shown or described. In particular, various illustrated components, such as a summation block, multiplier, or latch, may contain several sub-components that are not shown and which contribute to the operation of the components. The timing and operation of the components may also be different than those described or shown. For example, values of $\Lambda(\alpha^{-i})$ and $\Omega(\alpha^{-i})$ for i=0, . . . , n, may be computed in more than n clock cycles or less than n clock cycles.

Variations of the Forney algorithm or another equivalent technique can be used to produce error values. In one embodiment, an error value $e_i$ can be computed based on an error locator polynomial $\Lambda(x)$ and a scratch polynomial $B(x)$ generated by BMA, without using an error evaluator polynomial $\Omega(x)$:

$$e_i = \frac{X^{-(2t-2+b)}}{B(X_i^{-1})\Lambda'(X_i^{-1})}, \quad \text{(EQ12)}$$

where $x=\alpha^{-i}$. This error value can be computed concurrently with a Chien search, such that if $\Lambda(\alpha^{-i})=0$, then the symbol location i and error value $e_i$ can be stored in a memory. Equation EQ12 can be used to compute error values $e_i$ using $\Lambda(x)$ and $B(x)$ generated by BMA, but cannot be used to compute error values $e_i$ using error indicators generated by list decoding and/or iterative decoding.

Accordingly, what have been described are systems and methods for Reed-Solomon error evaluation and correction. The disclosed circuits, components, and methods can be implemented using means such as digital circuitry, analog circuitry, and/or a processor architecture with programmable instructions. Additionally, components and/or methods that store information or carry signals can operate based on electrical, optical, and/or magnetic technology, and can include devices such as flip-flops, latches, random access memories, read-only memories, CDs, DVDs, disk drives, or other storage or memory means. The disclosed embodiments and illustrations are exemplary and do not limit the scope of the disclosed technology as defined by the following claims.

What is claimed is:

1. A Reed-Solomon decoder for producing a dataword based on a decision-codeword, the decoder comprising:
   a memory, the memory storing a first error locator polynomial and a second error locator polynomial, each generated from the decision-codeword; and
   an error correction circuit for producing the dataword by processing at least the first error locator polynomial, the error correction circuit operable to:
      process the first error locator polynomial according to an accelerated Chien search to determine if the first error locator polynomial is valid,
      in response to a determination that the first error locator polynomial is valid, produce the dataword by further processing the first error locator polynomial according to a non-accelerated Chien search, and
      in response to a determination that the first error locator polynomial is not valid, process the second error locator polynomial according to the accelerated Chien search to determine if the second error locator polynomial is valid.

2. The Reed-Solomon decoder of claim 1, wherein the memory further stores:
   an error evaluator polynomial corresponding to the first error locator polynomial.

3. The Reed-Solomon decoder of claim 2, further comprising evaluating the error evaluator polynomial during the processing of the first error locator polynomial according to the non-accelerated Chien search.

4. The Reed-Solomon decoder of claim 1, wherein the error correction circuit comprises circuitry for identifying error locations.

5. The Reed-Solomon decoder of claim 4, wherein the circuitry for identifying error locations comprises Chien search circuitry.

6. The Reed-Solomon decoder of claim 4, wherein the circuitry for identifying error locations comprises circuitry for evaluating an error locator polynomial having a plurality of terms.

7. The Reed-Solomon decoder of claim 6, wherein the circuitry for evaluating an error locator polynomial comprises:
   a first summation circuit for computing a sum of even-positioned terms in the plurality of terms; and
   a second summation circuit for computing a sum of odd-positioned terms in the plurality of terms.

8. The Reed-Solomon decoder of claim 1, wherein the error correction circuit comprises circuitry for computing error values.

9. The Reed-Solomon decoder of claim 8, wherein the circuitry for computing error values uses Forney's algorithm to compute an error value $e_i$ based on:

$$e_i = \frac{X_i^{2-b}\Omega(X_i^{-1})}{\Lambda'(X_i^{-1})},$$

where,
   i is an integer in a range [0,n−1],
   b is a constant integer,
   $X_i=\alpha^i$, where $\alpha$ is a primitive element,
   $\Lambda'(x)$ is a formal derivative of an error locator polynomial, and
   $\Omega(x)$ is an error evaluator polynomial.

10. The Reed-Solomon decoder of claim 8, wherein the circuitry for computing error values computes an error value $e_i$ based on:

$$e_i = \frac{X^{-(2t-2+b)}}{B(X_i^{-1})\Lambda'(X_i^{-1})},$$

where,
   i is an integer in the range [0,n−1],
   $X_i=\alpha^i$, where $\alpha$ is a primitive element,
   2t=(n−k), where n is a length of the decision-codeword and k is a length of a dataword, $\Lambda'(x)$ is a formal derivative of an error locator polynomial, and $B(x)$ is an scratch polynomial.

11. The Reed-Solomon decoder of claim 8, wherein the circuitry for computing error values is operable to identify error locations.

12. The Reed-Solomon decoder of claim 3, wherein:
the second error locator polynomial is processed to determine if the second error locator polynomial is a final error locator polynomial, and
in response to a determination that the second error locator polynomial is the final error locator polynomial, the error correction circuit processes the second error locator polynomial according to an accelerated Chien search.

13. The Reed-Solomon decoder of claim 12, wherein the second error locator polynomial is determined to be the final error locator polynomial if the second error locator polynomial is a only polynomial in a set of polynomials that has not been determined to be invalid.

14. A Reed-Solomon decoder for producing a dataword based on a decision-codeword, the decoder comprising:
a memory, the memory storing an error locator polynomial generated from the decision-codeword; and
error correction means for producing the dataword by processing the error locator polynomial, said error correction means operable to:
process the error locator polynomial according to an accelerated Chien search to determine if the error locator polynomial is valid, and
in response to a determination that the error locator polynomial is valid, further process the error locator polynomial according to a non-accelerated Chien search to identify error locations in the decision codeword, and
produce the dataword by correcting values of the decision-codeword at the identified error locations.

15. The Reed-Solomon decoder of claim 14, further comprising:
generating a set of error locator polynomials corresponding to a received codeword, the set of error locator polynomials comprising the error locator polynomial; and
storing the set of error locator polynomials in the memory.

16. The Reed-Solomon decoder of claim 15, further comprising:

determining, after the processing of the error locator polynomial, if the error locator polynomial corresponds to a final error locator polynomial remaining to be validated, and declaring, after the processing of the error locator polynomial, a decoding error in response to a determination that the error locator polynomial is the final error locator polynomial.

17. A disk drive system comprising:
a storage medium;
write path circuitry for writing encoded data to the storage medium; and
read path circuitry for reading encoded data from the storage medium, the read path circuitry comprising a Reed-Solomon decoder, the Reed-Solomon decoder comprising:
a memory, the memory storing a first error locator polynomial and a second error locator polynomial, each generated from a decision-codeword; and
an error correction circuit for producing a dataword by processing at least the first error locator polynomial, the error correction circuit operable to:
process the first error locator polynomial according to an accelerated Chien search to determine if the first error locator polynomial is valid,
in response to a determination that the first error locator polynomial is valid, produce the dataword by further processing the first error locator polynomial according to a non-accelerated Chien search, and
in response to a determination that the first error locator polynomial is not valid, process the second error locator polynomial according the accelerated Chien search to determine if the second error locator polynomial is valid.

18. The disk drive system of claim 17, wherein the error correction circuit comprises circuitry for identifying error locations.

19. The disk drive system of claim 18, wherein the circuitry for identifying error locations comprises circuitry for evaluating an error locator polynomial having a plurality of terms.

20. The disk drive system of claim 19, wherein the circuitry for evaluating an error locator polynomial comprises:
a first summation circuit for computing a sum of even-positioned terms in the plurality of terms; and
a second summation circuit for computing a sum of odd-positioned terms in the plurality of terms.

* * * * *